United States Patent
Chen et al.

(10) Patent No.: US 10,217,904 B2
(45) Date of Patent: Feb. 26, 2019

(54) LIGHT-EMITTING DEVICE WITH METALLIZED MOUNTING SUPPORT STRUCTURE

(71) Applicant: EPISTAR CORPORATION, Hsinchu (TW)

(72) Inventors: Hung-Hsuan Chen, Hsinchu (TW); Chih-Peng Ni, Hsinchu (TW); Jui-Hsien Chang, Hsinchu (TW); Hsin-Yu Lee, Hsinchu (TW); Tsen-Kuei Wang, Hsinchu (TW); Chen-Yen Fan, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/013,439

(22) Filed: Feb. 2, 2016

(65) Prior Publication Data
US 2016/0225955 A1    Aug. 4, 2016

Related U.S. Application Data

(60) Provisional application No. 62/111,280, filed on Feb. 3, 2015.

(51) Int. Cl.
| | | |
|---|---|---|
| H01L 29/18 | (2006.01) |
| H01L 33/00 | (2010.01) |
| H01L 33/38 | (2010.01) |
| H01L 33/60 | (2010.01) |
| H01L 33/48 | (2010.01) |
| H01L 33/62 | (2010.01) |
| H01L 33/50 | (2010.01) |
| H01L 25/075 | (2006.01) |
| H01L 21/56 | (2006.01) |

(52) U.S. Cl.
CPC .......... *H01L 33/385* (2013.01); *H01L 33/486* (2013.01); *H01L 33/60* (2013.01); *H01L 33/62* (2013.01); *H01L 21/568* (2013.01); *H01L 25/0753* (2013.01); *H01L 33/0095* (2013.01); *H01L 33/387* (2013.01); *H01L 33/505* (2013.01); *H01L 2224/18* (2013.01)

(58) Field of Classification Search
CPC ......... H01L 2924/12041; H01L 33/486; H01L 33/62; F21S 4/20
See application file for complete search history.

(56) References Cited

U.S. PATENT DOCUMENTS

| 2003/0071365 A1 | 4/2003 | Kobayakawa et al. |
| 2006/0006404 A1 | 1/2006 | Ibbetson et al. |
| 2006/0163683 A1* | 7/2006 | Roth .................. C09K 11/7792 257/432 |

(Continued)

FOREIGN PATENT DOCUMENTS

| KR | 1020140147162 | 12/2014 |
| WO | WO-2013/151387 | 10/2013 |

*Primary Examiner* — Ismail A Muse
(74) *Attorney, Agent, or Firm* — Muncy, Geissler, Olds & Lowe, P.C.

(57) ABSTRACT

This disclosure discloses a light-emitting device. The light-emitting device has a first outermost sidewall and includes a light-emitting diode and an electrode. The light-emitting diode has a pad and a side surface. The electrode has a segment formed on the pad to extend beyond the side surface, and a first protrusion extending from the segment to the first outermost sidewall.

19 Claims, 24 Drawing Sheets

(56) References Cited

U.S. PATENT DOCUMENTS

| | | | |
|---|---|---|---|
| 2010/0164079 A1* | 7/2010 | Dekker | H01L 21/4846 257/676 |
| 2011/0291145 A1* | 12/2011 | Han | H01L 33/0079 257/98 |
| 2012/0080674 A1* | 4/2012 | Shimizu | H01L 24/97 257/48 |
| 2012/0086041 A1* | 4/2012 | Isogai | H01L 33/62 257/99 |
| 2012/0161180 A1* | 6/2012 | Komatsu | H01L 33/486 257/98 |
| 2013/0037830 A1* | 2/2013 | Jang | H01L 33/60 257/88 |
| 2013/0037929 A1* | 2/2013 | Essig | H01L 23/49816 257/693 |
| 2013/0119426 A1* | 5/2013 | Katoh | H01L 33/486 257/98 |
| 2013/0127328 A2* | 5/2013 | Ishihara | H01L 33/505 313/498 |
| 2013/0214312 A1* | 8/2013 | Sohn | H01L 33/507 257/98 |
| 2014/0014990 A1 | 1/2014 | Kim et al. | |
| 2014/0054629 A1* | 2/2014 | Kim | H01L 27/15 257/91 |
| 2014/0113391 A1* | 4/2014 | Jeong | H01L 33/50 438/27 |
| 2014/0183444 A1 | 7/2014 | Chen et al. | |
| 2014/0319663 A1* | 10/2014 | Shibasaki | H01L 21/4828 257/670 |
| 2014/0361326 A1* | 12/2014 | Song | H01L 33/40 257/98 |
| 2014/0362565 A1 | 12/2014 | Yao et al. | |
| 2015/0001563 A1* | 1/2015 | Miki | H01L 33/54 257/98 |
| 2015/0014714 A1* | 1/2015 | Lin | H01L 25/0753 257/88 |
| 2015/0060905 A1* | 3/2015 | Nam | H01L 25/0753 257/89 |
| 2015/0076541 A1* | 3/2015 | Ikeda | H01L 33/60 257/98 |
| 2015/0084080 A1* | 3/2015 | Kawakita | H01L 25/167 257/98 |
| 2015/0091035 A1* | 4/2015 | Kim | H01L 33/54 257/98 |
| 2015/0115793 A1* | 4/2015 | Miyashita | H05B 33/04 313/512 |
| 2015/0171281 A1* | 6/2015 | Nakabayashi | H01L 33/486 257/98 |
| 2015/0188011 A1* | 7/2015 | Kang | H01L 33/60 257/98 |
| 2015/0194585 A1* | 7/2015 | Kim | H01L 33/62 257/99 |
| 2016/0027977 A1* | 1/2016 | Seo | H01L 33/60 257/98 |
| 2016/0149103 A1* | 5/2016 | Oh | H01L 33/62 362/612 |
| 2016/0358896 A1* | 12/2016 | Jeon | H01L 25/0753 |

\* cited by examiner

US 10,217,904 B2

LIGHT-EMITTING DEVICE WITH METALLIZED MOUNTING SUPPORT STRUCTURE

REFERENCE TO RELATED APPLICATION

This application claims the benefit of U.S. Provisional Application Ser. No. 62/111,280, filed on Feb. 3, 2015, the content of which is hereby incorporated by reference.

BACKGROUND

Technical Field

The present disclosure relates to a light-emitting device having an electrode with a protrusion.

Description of the Related Art

The light-emitting device of the solid-state lighting elements have the characteristics of low power consumption, long operational life, small volume, quick response and good opto-electrical property like light emission with a stable wavelength so the light-emitting device have been widely used in various applications. However, how to make a light-emitting device with a good quality and a cost effective is still an issue.

SUMMARY OF THE DISCLOSURE

This disclosure discloses a light-emitting device.

The light-emitting device has a first outermost sidewall and includes a light-emitting diode and an electrode. The light-emitting diode has a pad and a side surface. The electrode has a segment formed on the pad to extend beyond the side surface, and a first protrusion extending from the segment to the first outermost sidewall.

BRIEF DESCRIPTION OF THE DRAWING

The accompanying drawings are included to provide easy understanding of the application, and are incorporated herein and constitutes a part of this specification. The drawings illustrate the embodiments of the application and, together with the description, serves to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of embodiments of the present disclosure accompanied with the drawings.

Figure 1A:
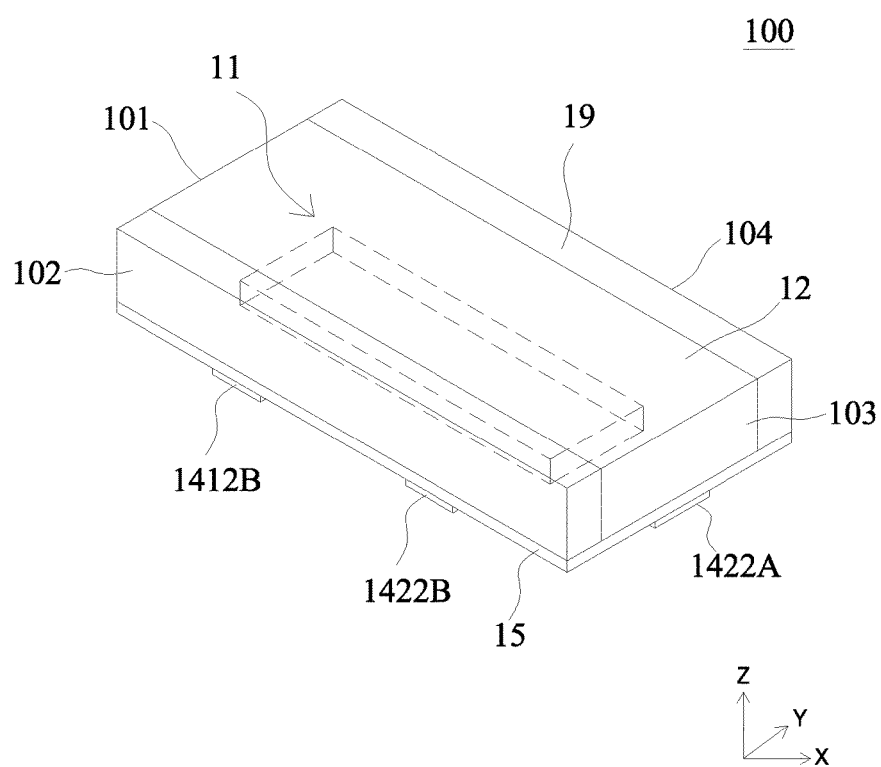
FIG. 1A is a perspective view of a light-emitting device in accordance with one embodiment of the present disclosure.
Figure 1B:
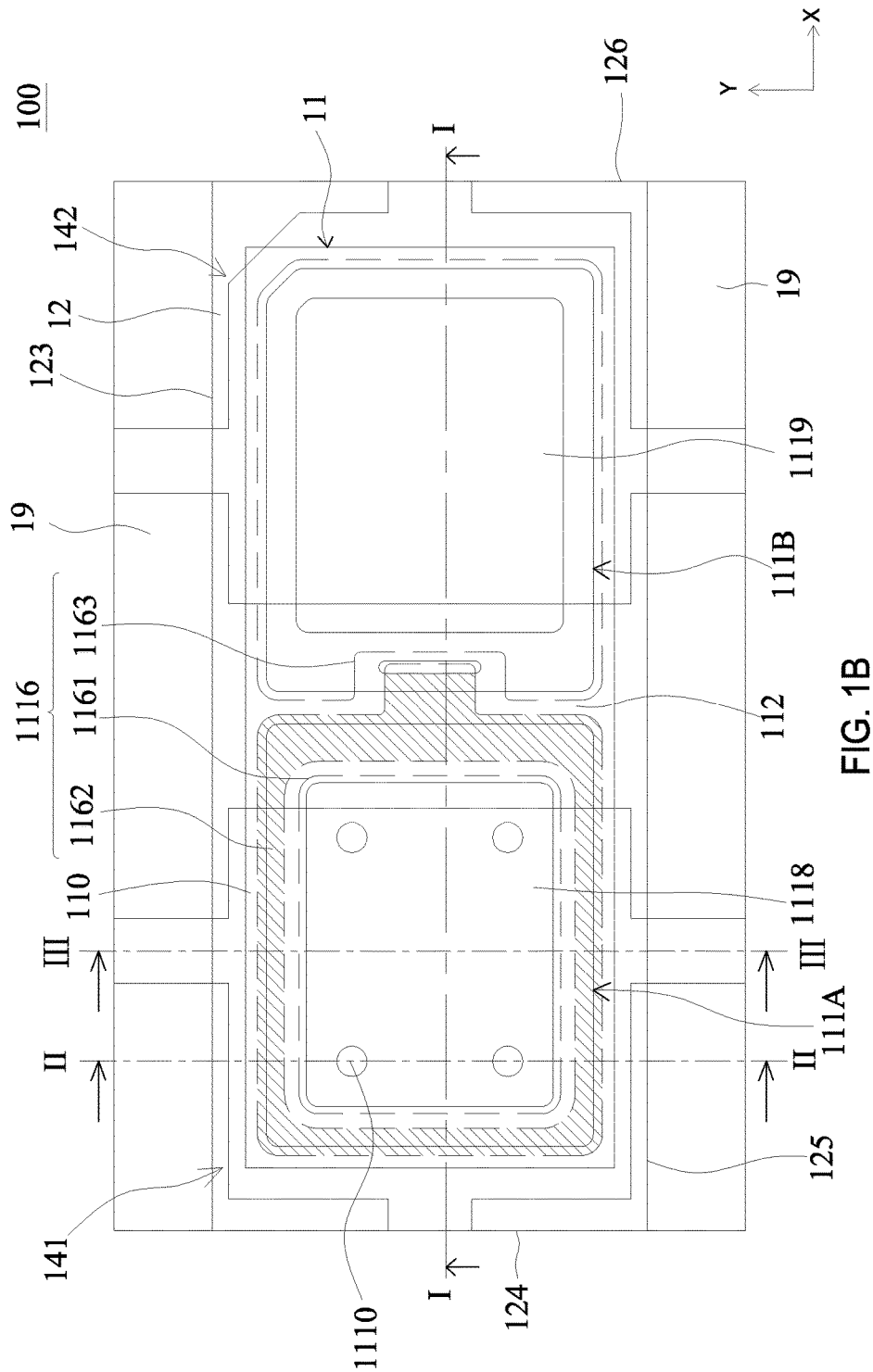
FIG. 1B is a bottom view of the light-emitting device shown in FIG. 1A.
Figure 1C:
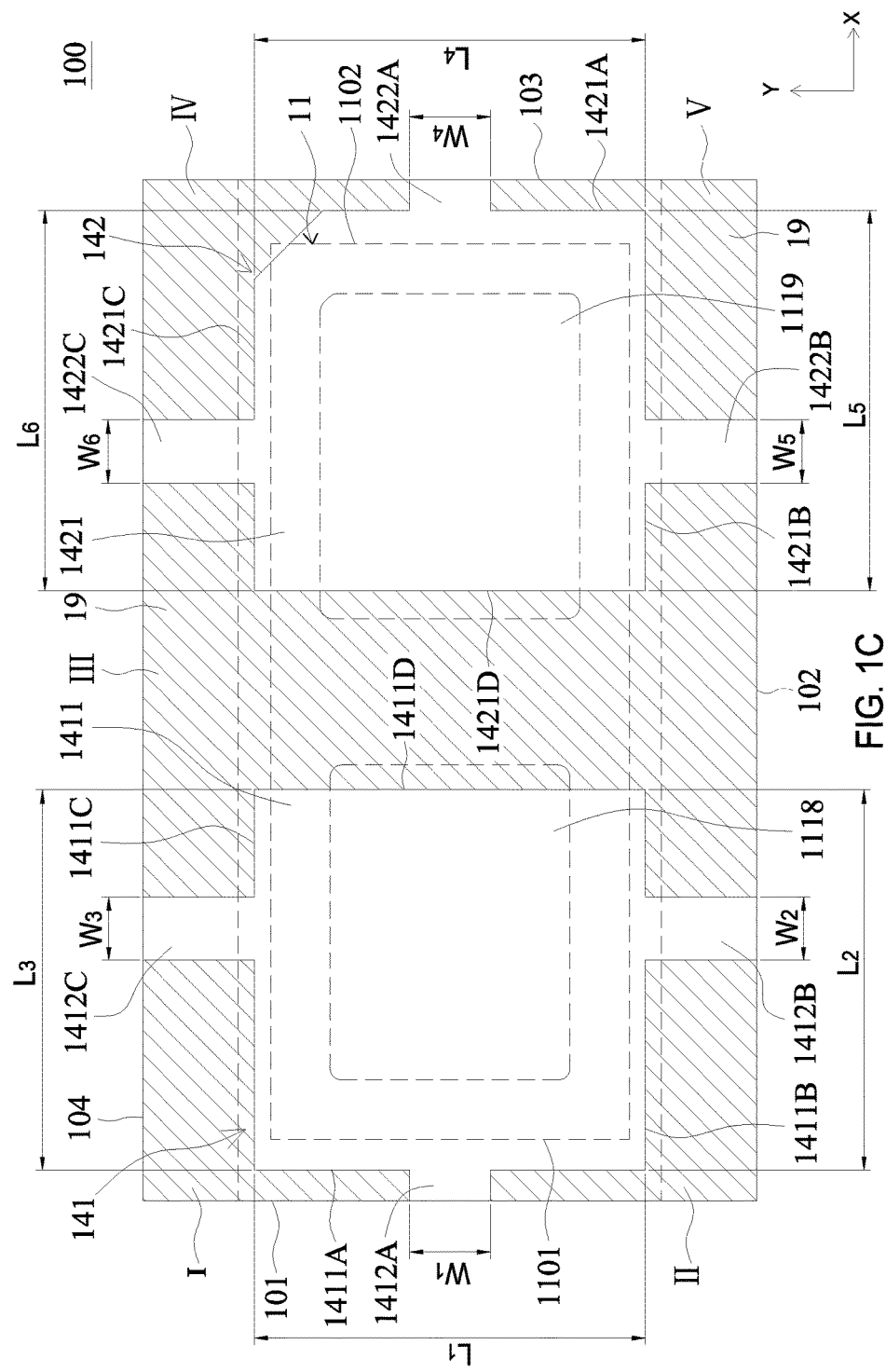
FIG. 1C is a bottom view of the light-emitting device shown in FIG. 1A.
Figure 1D:
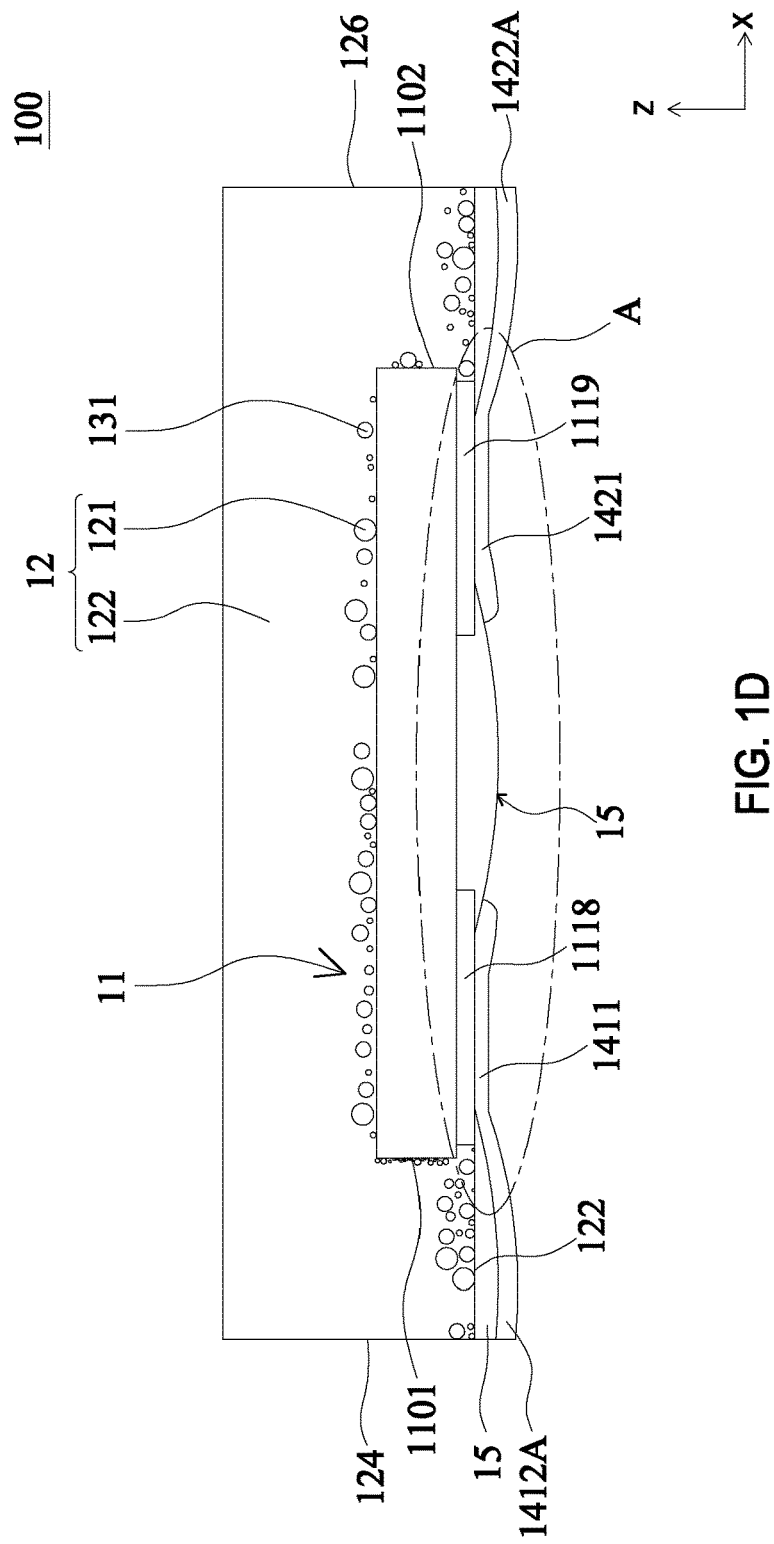
FIG. 1D is a cross-sectional view taken along line I-I in FIG. 1B.
Figure 1E:
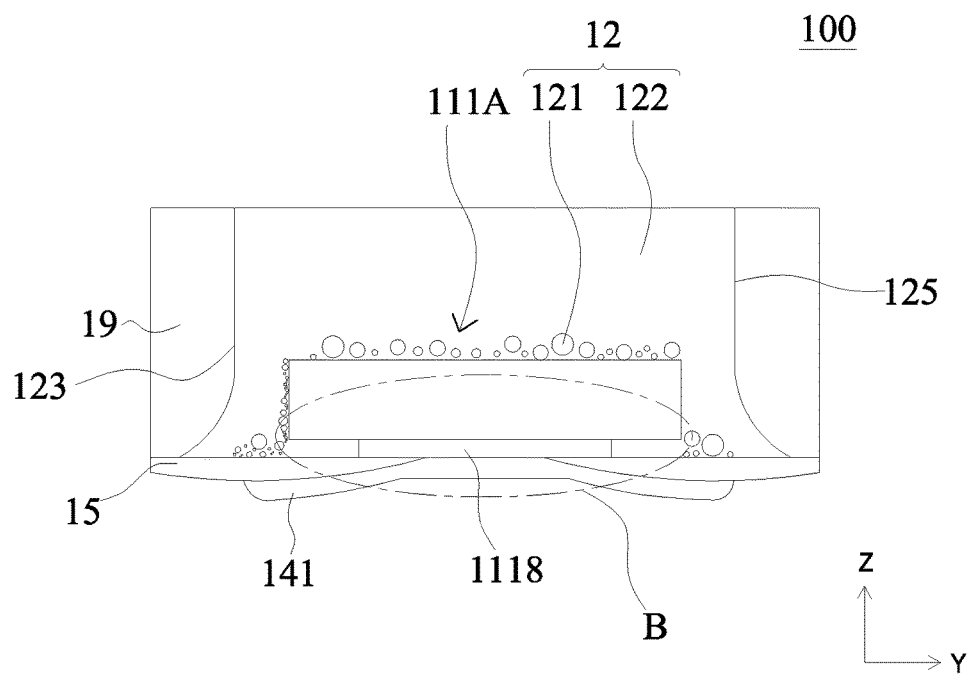
FIG. 1E is a cross-sectional view taken along line II-II in FIG. 1B.
Figure 1F:
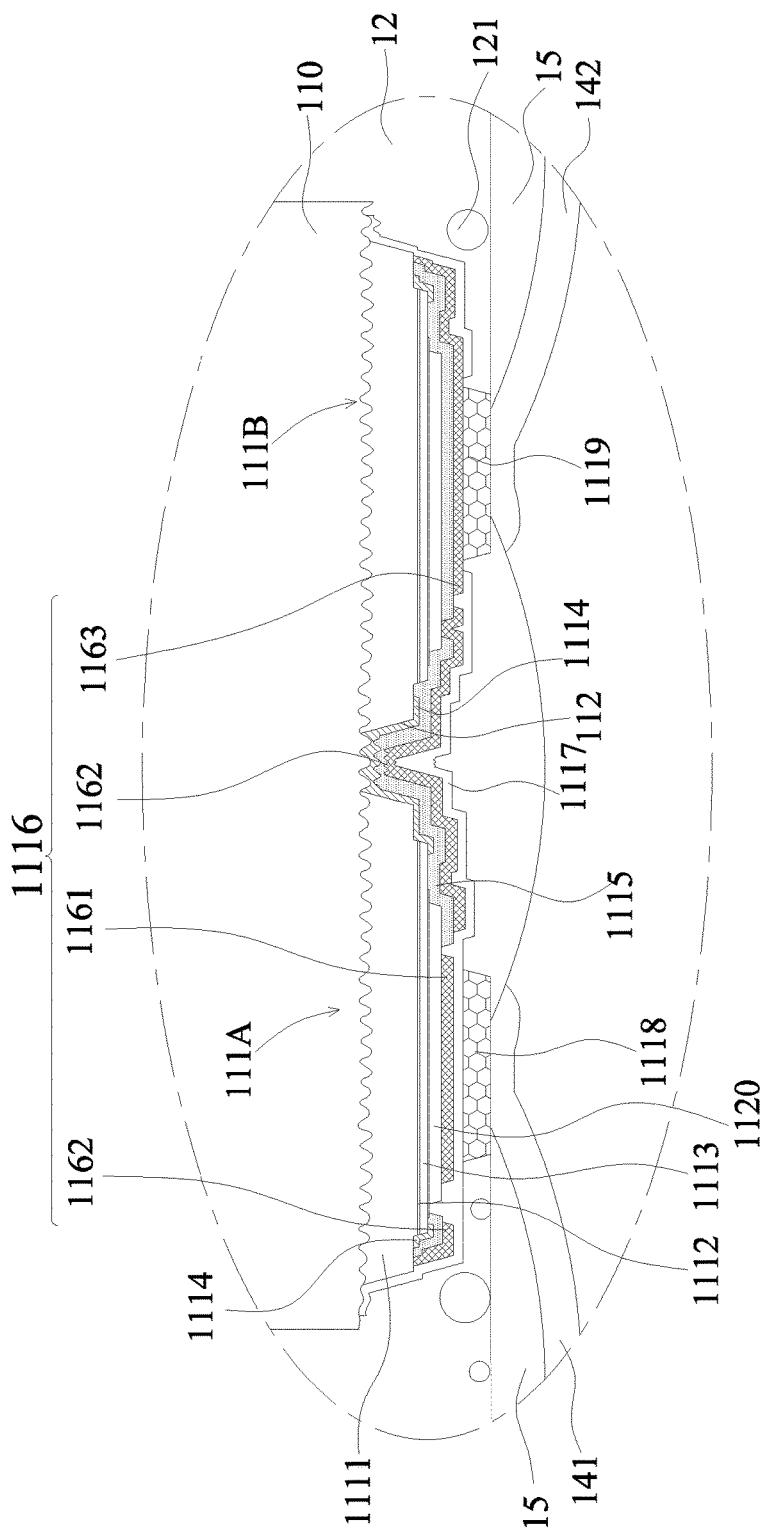
FIG. 1F is an enlarged view of area A in FIG. 1D.
Figure 1G:
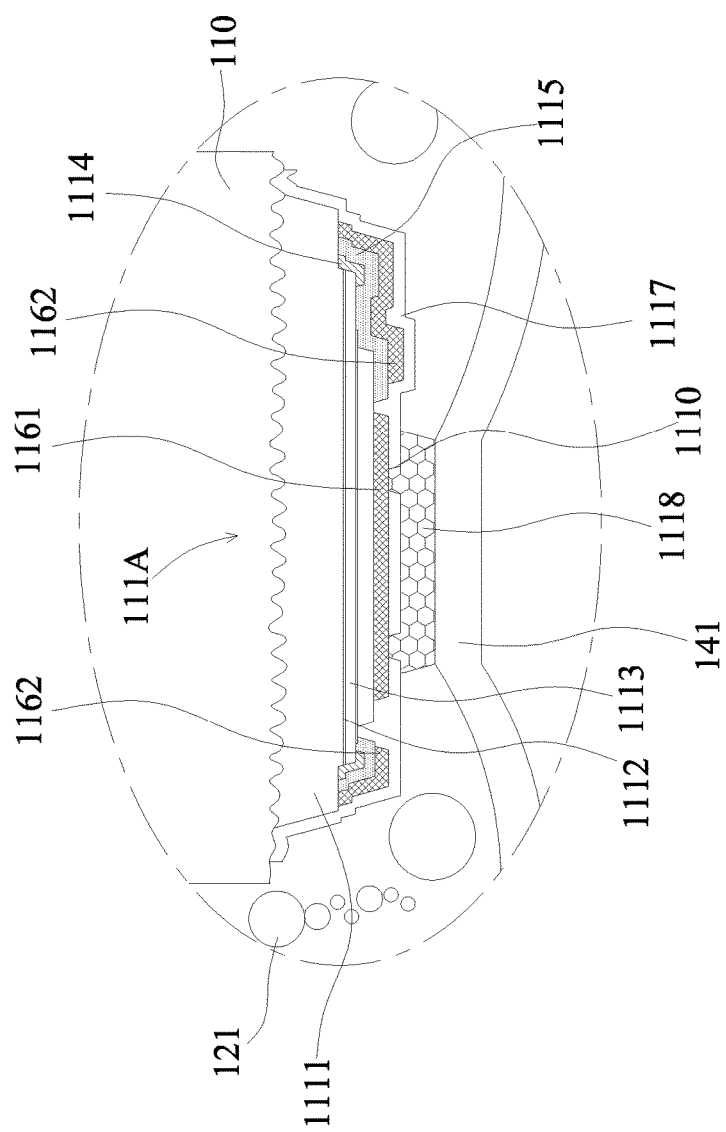
FIG. 1G is an enlarged view of area B in FIG. 1E.
Figure 1H:
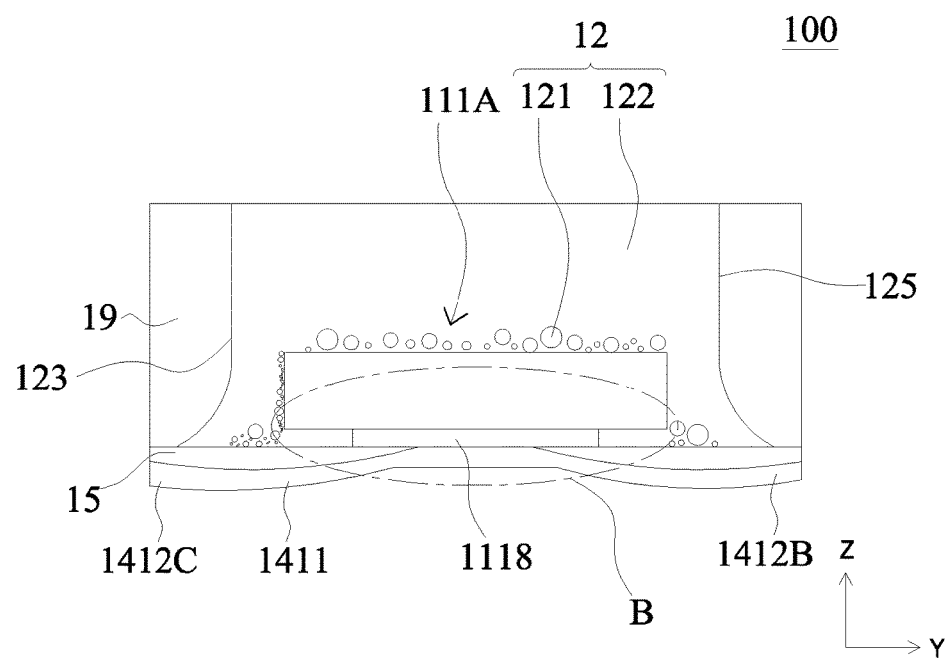
FIG. 1H is a cross-sectional view taken along line III-III in FIG. 1B.

FIG. 1A is a perspective view of a light-emitting device 100 in accordance with one embodiment of the present disclosure. FIG. 1B is a bottom view of FIG. 1A. FIG. 1C is a bottom view of FIG. 1A. FIG. 1D is a cross-sectional view taken along line I-I in FIG. 1B. FIG. 1E is a cross-sectional view taken along line II-II in FIG. 1B. FIG. 1F is an enlarged view taken from area A in FIG. 1D. FIG. 1G is an enlarged view taken from area B in FIG. 1E. FIG. 1H is a cross-sectional view taken along line III-III in FIG. 1B. For clear illustration, only some layers are shown in FIG. 1B, and each layer is drawn in solid lines (an electrical connection 1116 is drawn in dashed lines and is discussed later) regardless of an opaque, transparent, or translucent material.

As shown in FIGS. 1A and 1B, the light-emitting device 100 includes a light-emitting diode 11, a wavelength conversion structure 12 enclosing the light-emitting diode 11, a first electrode 141, a second electrode 142, an insulation structure 15, and a reflective wall 19. The first electrode 141 and the second electrode 142 are configured to electrically connect to an external circuit (not shown) by surface mounting technology.

For clear illustration, the first electrode 141, the second electrode 142, the light-emitting diode 11 with pads 1118, 1119, and the reflective wall 19 are shown in FIG. 1C. As shown in FIGS. 1A and 1C, the light-emitting device 100 is substantially a cuboid with four outermost sidewalls 101~104. Each of the first electrode 141 and the second electrode 142 has a main segment 1411, 1421 and a plurality of protrusions. In one embodiment, the first electrode 141 has three protrusions 1412A, 1412B, 1412C; the second electrode 142 has three protrusions 1422A, 1422B, 1422C. In FIG. 1C, the main segments 1411, 1421 are located inside the four outermost sidewalls 101~104 and have four sides 1411A~D, 1421A~D. The sides 1411A, 1411B, 1411C are distant from the outermost sidewalls 101, 102, 104, respectively, by a distance of about 10~150 μm. The sides 1421A, 1421B, 1421C are distant from the outermost sidewalls 103, 102, 104, respectively, by a distance of about 10~150 μm.

The protrusion 1412A outwardly extends from the side 1411A of the main segment 1411 along an X-axis (−X direction) to the outermost sidewall 101. The protrusions 1412B, 1412C extend from the main segment 1411 along a y-axis in opposite directions (+Y direction and −Y direction). Specifically, the protrusion 1412B extends from the side 1411B of the main segment 1411 to the outermost sidewall 102 and the protrusions 1412C extends from the side 1411C of the main segment 1411 to the outermost sidewall 104. Furthermore, the protrusion 1412A has a width (W1) of 0.15~1 times the length (L1) of the side 1411A. The protrusion 1412B has a width (W2) of 0.15~1 times the length (L2) of the side 1411B. The protrusion 1412C has a width (W3) of 0.15~1 times the length (L3) of the side 1411C.

The protrusion 1422A extends from the side 1421A of the main segment 1421 along the X-axis (+X direction) to the outermost sidewall 103. The protrusions 1422B, 1422C extend from the main segment 1421 along the y-axis in opposite directions (+Y direction and −Y direction). Specifically, the protrusion 1422B extends from the side 1421B of the main segment 1421 to the outermost sidewall 102 and the protrusions 1422C extends from the side 1421C of the main segment 1421 to the outermost sidewall 104. The protrusion 1422A has a width (W4) of 0.15~1 times the length (L4) of the side 1421A. The protrusion 1422B has a width (W5) of 0.15~1 times the length (L5) of the side 1421B. The protrusion 1422C has a width (W6) of 0.15~1 times the length (L6) of the side 1421C. The protrusions 1412A and 1422A extend in opposite directions (−+X direction and +X direction). The protrusions 1412B, 1422B are parallel to each other and the protrusions 1412C, 1422C are parallel to each other. The protrusions are used as a conductive path for an electroplating process. To form the conductive path, at least two protrusions in each electrode are required. (It will be described later).

As shown in FIG. 1C, the first electrode 141 and the second electrode 142 are configured to divide the bottom surface of the light-emitting device 100 into the five regions (I~V) where no electrode is formed (discussed later).

As shown in FIGS. 1A, 1B, 1D and 1E, the wavelength conversion structure 12 is substantially a cuboid with four side surface 123~126. The reflective wall 19 only covers the side surfaces 123, 125 without covering the side surfaces 124, 126. The reflective wall 19 is configured to reflect light emitted from the light-emitting diode 11 away from the light-emitting device 100.

As shown in FIGS. 1C, 1D and 1H, the protrusions 1412B, 1412C (1422B, 1422C) are formed on the reflective wall 19 and overlap the reflective wall 19 in the Z direction. In addition, the protrusions 1412B, 1412C (1422B, 1422C) have a portion overlapping the wavelength conversion structure 12 in the Z direction. The protrusions 1412A, 1422A overlap the wavelength conversion structure 12 in the Z direction without overlapping the reflective wall 19.

The wavelength conversion structure 12 includes a first matrix 122 and a plurality of wavelength conversion particles 121 dispersed in the first matrix 122 to absorb and convert a first light from the light-emitting diode 11 into a second light with a peak wavelength or dominant wavelength different from that the first light. The first matrix 122 includes silicone-based material, epoxy-based material or both, and has a refractive index (n) of about 1.4~1.6 or 1.5~1.6. The wavelength conversion particles 121 include one or more kinds of inorganic phosphor, organic fluorescent colorants, semiconductors, or combinations thereof. The inorganic phosphor includes yellow-greenish phosphor, red phosphor, or blue phosphor. The yellow-greenish phosphor includes YAG, TAG, silicate, vanadate, alkaline-earth metal selenide, or metal nitride. The red phosphor includes fluoride ($K_2TiF_6:Mn^{4+}$, $K_2SiF_6:Mn^{4+}$), silicate, vanadate, alkaline-earth metal sulfide, metal nitride oxide, a mixture of tungstate and molybdate. The blue phosphor includes $BaMgAl_{10}O_{17}:Eu^{2+}$. The semiconductors includes quantum dot material which can be one material selected from the group consisting of ZnS, ZnSe, ZnTe, ZnO, CdS, CdSe, CdTe, GaN, GaP, GaSe, GaSb, GaAs, MN, AlP, AlAs, InP, InAs, Te, PbS, InSb, PbTe, PbSe, SbTe, ZnCdSeS, CuInS, $CsPbCl_3$, $CsPbBr_3$, and $CsPbI_3$.

The first light can be mixed with the second light to produce a white light or a non-white light. In one embodiment, the white light has chromaticity coordinates (x, y) on CIE 1931 chromaticity diagram, wherein $0.27 \le x \le 0.285$; $0.23 \le y \le 0.26$. In other embodiment, the white light has a correlated color temperature of about 2200K~6500K (ex. 2200K, 2400K, 2700K, 3000K, 5000K, 5700K, 6500K), and the chromaticity coordinates (x, y) is within a seven-step MacAdam ellipse on CIE 1931 chromaticity diagram. The non-white light can be a purple light, amber light, green light, or yellow light.

The reflective wall 19 is formed by curing a white paint. The white paint includes a second matrix and a plurality of reflective particles (not shown) dispersed in the second matrix. The second matrix includes silicone-based material, epoxy-based material or both, and has a refractive index (n) of about 1.4~1.6 or 1.5~1.6. In one embodiment, the second matrix includes polyimide (PI), BCB, perfluorocyclobutane (PFCB), polymethyl methacrylate (PMMA), polyethylene terephthalate (PET), polycarbonate (PC), polyetherimide, or fluorocarbon polymer. The reflective particles include titanium dioxide, silicon dioxide, aluminum oxide, zinc oxide, or zirconium dioxide. In one embodiment, when light emitted from the light-emitting diode strikes the reflective wall 19, the light can be reflected. Specifically, the reflection at the reflective wall 19 belongs to diffuse reflection.

The white paint has a viscosity of about 0.5-1000 Pa·s (for example, 0.5, 1, 2, 10, 30, 100, 500, 1000) and the reflective wall 19 (after fully curing the white paint) has a hardness of about 40-90 (Shore D). In one embodiment, the white paint has a viscosity of about 100-10000 Pas (for example, 100, 300, 500, 1000, 5000, 10000) and the reflective wall 19 has a hardness of about 30-60 (Share D). The insulation structure 15 is functioned to reflect light and can be made of a material referred to the reflective wall 19. If the insulation structure 15 and the reflective wall 19 have the same or similar matrices, an interface between the insulation structure 15 and the reflective wall 19 cannot been seen or become blurred while inspecting by scanning electron microscope.

As shown in FIGS. 1B~1G, the light-emitting diode 11 includes a patterned substrate 110, two light-emitting bodies 111A, 111B commonly formed on the patterned substrate 110, a trench 112 formed between the two light-emitting bodies 111A, 111B to physically separate the light-emitting bodies 111A, 111B. Each of the light-emitting bodies 111A, 111B includes a first-type semiconductor layer 1111, an active layer 1112, and a second-type semiconductor layer 1113. A first insulation layer 1114 is formed in the trench 112 and covers the first-type semiconductor layers 1111 of the light-emitting bodies 111A, 111B to prevent unnecessary electrical path (short circuit) generated between the light-emitting bodies 111A, 111B.

A second insulation layer 1115 is formed on the first insulation layer 1114 to expose the second-type semiconductor layers 1113 of the light-emitting bodies 111A, 111B. An electrical connection 1116 is formed on the second insulation layer 1115 to expose the light-emitting bodies 111A, 111B. In addition, the second insulation layer 1115 covers a sidewall of the first insulation layer 1114. The electrical connection 1116 covers a portion of a sidewall of the second insulation layer 1115 and extends to the first-type semiconductor layer 1111.

A third insulation layer 1117 is formed on the electrical connection 1116 to cover the light-emitting bodies 111A, 111B for exposing a portion of the electrical connection 1116. A first pad 1118 and a second pad 1119 are electrically connected to the light-emitting bodies 111A, 111B, respectively. The electrical connection 1116 between the light-emitting bodies 111A, 111B will be described later. An ohmic contact layer 1120 is optionally formed between the second-type semiconductor layer 1113 and the electrical connection 1116 for reducing forward voltage (Vf) of the light-emitting device 100.

For clear illustration, the electrical connection 1116 in FIG. 1B is shown in dashed lines. Referring to FIGS. 1B, 1D, and 1F, the electrical connection 1116 has a first region 1161, a second region 1162 (the hatched region in FIG. 1B) and a third region 1163. The first region 1161 is formed on the light-emitting body 111A and physically separated from the second region 1162. The second region 1162 surrounds the first region 1161. The second region 1162 contacts the first-type semiconductor layer 1111 of the light-emitting body 111A and is further formed the second insulation layer 1115 in the trench 112 to extend to the second-type semiconductor layer 1113 of the light-emitting body 111B such that the electrical connection 1116 serially and electrically connects the light-emitting body 111A with the light-emitting body 111B. (Due to the position of the cross-sectional line, the serial connection is not shown in FIG. 1F).

As shown in FIGS. 1B, 1E, and 1G, a plurality of holes 1110 is formed in the third insulation layer 1117. The holes 1110 are formed at a position corresponding to the light-emitting body 111A without forming at a position corresponding to the light-emitting body 111B. The first pad 1118 extends into the holes 1110 and electrically contact the first region 1161 of the electrical connection 1116 on the light-emitting body 111A so the first pad 1118 is electrically connected to the second-type semiconductor layer 1113 of the light-emitting body 111A. The third region 1163 is formed at a position corresponding to the light-emitting body 111B. The second pad 1119 directly contact the third region 1163 of the electrical connection 1116 exposed from the third insulation layer 1117. The third region 1163 of the electrical connection 1116 contacts the first-type semiconductor layer 1111 of the light-emitting body 111B.

In one embodiment, for example, when the first pad 1118 is electrically connected to a positive electrode of an external power and the second pad 1119 is electrically connected to a negative electrode of the external power, a current paths through the first pad 1118 in the holes 1110, the first region 1161 of the electrical connection 1116, the second-type semiconductor layer 1113 of the light-emitting body 111A, the active layer 1112 of the light-emitting body 111A, the first-type semiconductor layer 1111 of the light-emitting body 111A, the second region 1162 of the electrical connection 1116, the second-type semiconductor layer 1113 of the light-emitting body 111B, the active layer 1112 of the light-emitting body 111B, the first-type semiconductor layer 1111 of the light-emitting body 111B, the third region 1163 of the electrical connection 1116 to the second pad 1119. Therefore, the light-emitting body 111A is electrical connected to the light-emitting body 111B in series. In addition, referring to the aforesaid description, the step to form holes 1110 at the light-emitting body 111B can be omitted, and the electrical connection 1116 covers sidewalls of the light-emitting bodies 111A, 111B which can improve light intensity of the light-emitting device 100 and reduce the forward voltage (Vf) of the light-emitting device 100.

As shown in FIGS. 1C and 1D, the main segment 1411 of the first electrode 141 is formed on and electrically connected to the pad 1118 and extends beyond a side surface 1101 of the light-emitting diode 11. In other words, the side 1411A is closer to the outermost sidewall 101 than the side surface 1101. The main segment 1421 of the second electrode 142 is formed on and electrically connected to the pad 1119 and extends beyond a side surface 1102 of the light-emitting diode 11. In other words, the side 1421A is closer to the outermost sidewall 103 than the side surface 1102. The protrusions 1412A~C, 1422A~C is devoid of overlapping the pads 1118, 1119.

The first pad 1118, the second pad 1119, the electrical connection 1116, the first electrode 141, or the second electrode 142 is made of a metal, such as Au, Ag, Cu, Cr, Al, Pt, Ni, Ti, Sn or an alloy thereof or a stack thereof. The first insulation layer 1114 can be a single layer or a multilayer structure. When the first insulation layer 1114 is a single layer, it can be made of a material including oxide, nitride or polymer. The oxide can include $Al_2O_3$, $SiO_2$, $TiO_2$, $Ta_2O_5$, or $AlO_x$; the nitride can include AlN or $SiN_x$; the polymer can include polyimide or benzocyclobutene (BCB). When the first insulation layer 1114 is a multilayer structure, the multilayer structure can be made of a stack of alternate layers, each of which is made of $Al_2O_3$, $SiO_2$, $TiO_2$, or $Nb_2O_5$ to form a Distributed Bragg Reflector (DBR) structure. The second insulation layer 1115 and/or the third insulation layer 1117 can be made of one or more materials which can be referred to pertinent paragraphs directed to the first insulation layer 1114.

When the light-emitting diode 11 has a heterostructure, the first-type semiconductor layer 1111 and the second-type semiconductor layer 1113, for example a cladding layer or a confinement layer, provide holes and electrons, respectively, and each type layer has a bandgap greater than that of the active layer, thereby improving probability of electrons and holes combining in the active layer to emit light. The first-type semiconductor layer 1111, the active layer 1112, and the second-type semiconductor layer 1113 can be made of III-V group semiconductor materials, such as $Al_xIn_yGa_{(1-x-y)}N$ or $Al_xIn_yGa_{(1-x-y)}P$, wherein $0 \le x$, $y \le 1$; $(x+y) \le 1$. Depending on the material of the active layer 1112, the light-emitting diode 11 can emit a red light with a peak wavelength or dominant wavelength of 610~650 nm, a green light with a peak wavelength or dominant wavelength of 530~570 nm, a blue light with a peak wavelength or dominant wavelength of 450~490 nm, a purple light with a peak wavelength or dominant wavelength of 400~440 nm, or a UV light with a peak wavelength of 200~400 nm.

In FIG. 1B, the light-emitting bodies 111A, 111B are electrically connected with each other in series. In one embodiment, the light-emitting diode 11 can include a light-emitting body or more than three light-emitting bodies which are electrically connected with each other in series, parallel, a series-parallel configuration, or a bridge configuration. When the light-emitting diode 11 includes a plurality of light-emitting bodies, the light-emitting bodies can be commonly formed on a substrate. Alternatively, each of the light-emitting bodies has a substrate and they are mounted on a carrier. Alternatively, some light-emitting bodies are commonly formed on a substrate and some light-emitting bodies have a substrate, respectively, and then they are commonly mounted on a substrate. In addition, the light-emitting bodies 111A, 111B of the present disclosure are in a flip-chip form and are electrically connected with each other by the electrical connection 1116. In one embodiment, the light-emitting bodies 111A, 111B are in a horizontal form and electrically connected with each other by wire bonding.

FIGS. 2A~2J are cross-sectional views of steps of making a light-emitting device 200 in accordance with one embodiment of the present disclosure. FIGS. 3A~3J are top views of FIGS. 2A~2J, respectively. For simplification, the light-emitting diode 11 and the light-emitting device 200 are shown in cuboids in FIGS. 2A~2J as an exemplary illustration. In one embodiment, square, trapezoid, parallelogram, diamond, triangle, pentagon, hexagon, or round can be applied in the embodiment of the present disclosure. FIG. 3K is a top view showing a cutting step.

Figure 2A:
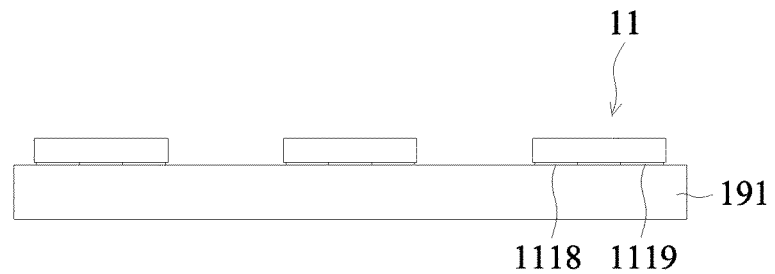
FIGS. 2A~2J are cross-sectional views of steps of making a light-emitting device in accordance with one embodiment of the present disclosure.
Figure 3A:
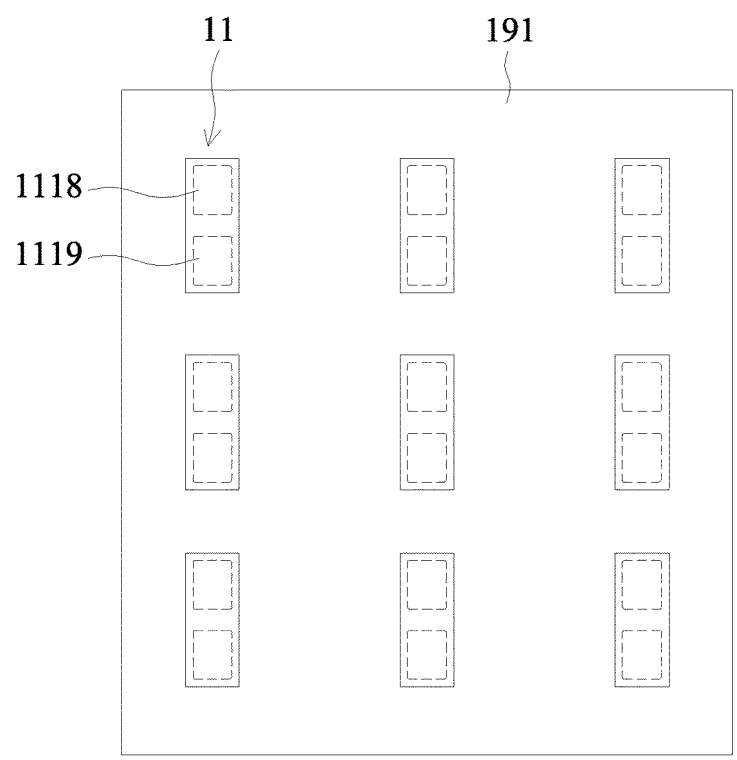
FIGS. 3A~3J are top views of 2A~2J, respectively.

As shown in FIGS. 2A and 3A, a plurality of light-emitting diodes 11 (nine light-emitting diodes are shown) is disposed on a temporary tape 191. The first pad 1118 and the second pad 1119 are attached to the temporary tape 191

Figure 2B:
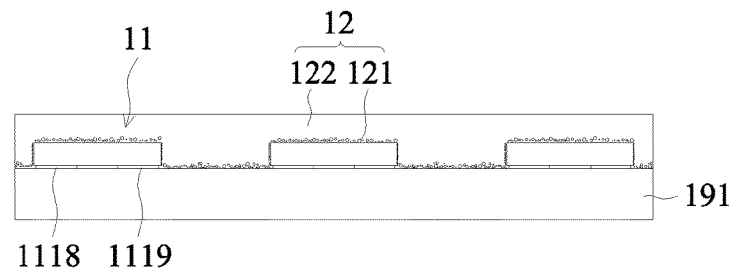
Figure 3B:
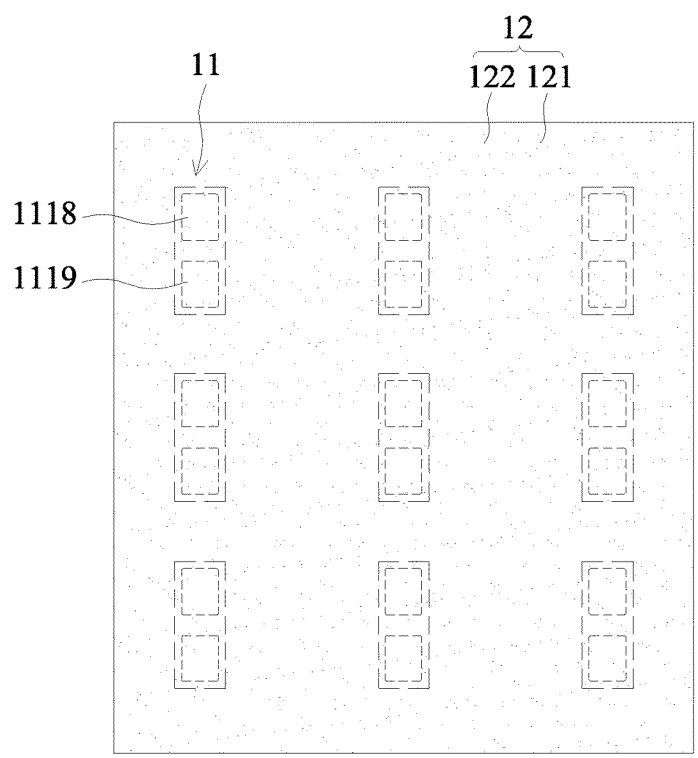

As shown in FIGS. 2B and 3B, a plurality of wavelength conversion particles 121 is mixed with a matrix 122 to form a wavelength conversion mixture. The wavelength conversion mixture is coated to fully enclose light-emitting diodes 11 therein. Thereafter, a heat treatment is conducted to cure the wavelength conversion mixture to form the wavelength conversion structure 12. In one embodiment, during the heat treatment, with the influence of the gravity, the wavelength conversion particles 121 will be precipitated to directly contact the light-emitting diodes 11.

In another embodiment, an anti-precipitation agent (for example, $SiO_2$) is added into the matrix 122 to slow down the precipitation of the wavelength conversion particles 121. Therefore, the wavelength conversion particles 121 can be uniformly dispersed within the matrix 122. In further embodiment, the wavelength conversion mixture can be pre-formed into a wavelength conversion sheet and then attached to the light-emitting diodes 11. In the wavelength conversion sheet, the wavelength conversion particles 121 are more uniformly dispersed within the matrix 122.

Figure 2C:
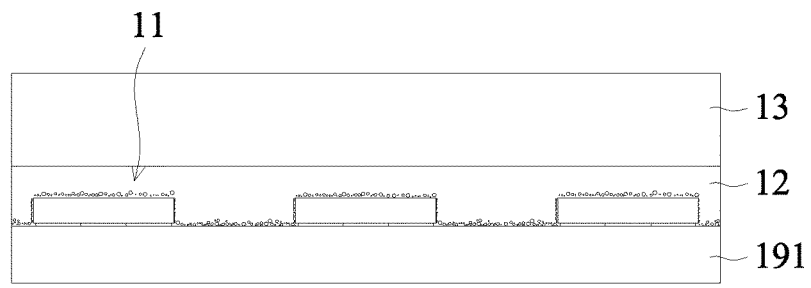
Figure 3C:
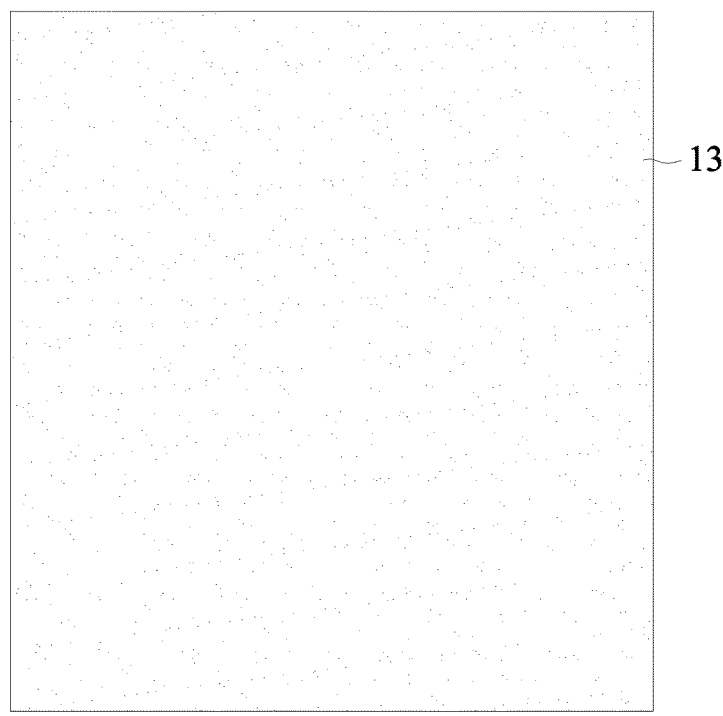

As shown in FIGS. 2C and 3C, a light-transmissive structure 13 is attached to the wavelength conversion structure 12. Specifically, a first bonding layer (not shown) is formed on the light-transmissive structure 13. A second bonding layer (not shown) is formed on the wavelength conversion structure 12. Thereafter, the first bonding layer and the second bonding layer are bonded together by hot pressing such that the light-transmissive structure 13 is bonded to the wavelength conversion structure 12.

Figure 2D:
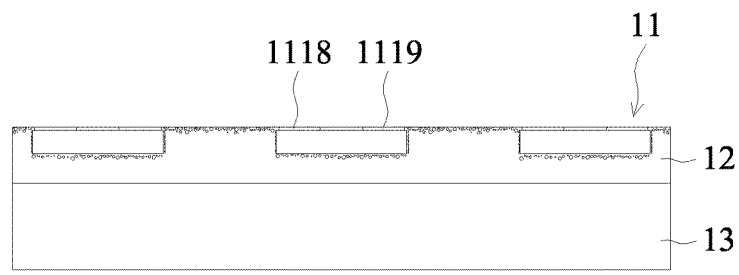
Figure 3D:
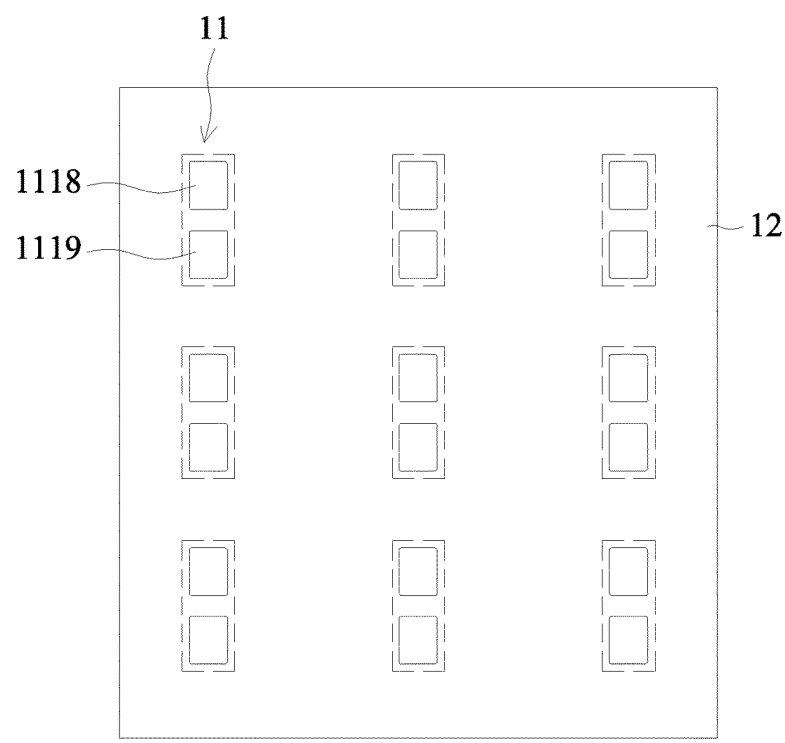

As shown in FIGS. 2D and 3D, the structure of FIG. 2C (or 3C) is reversed and the temporary tape 191 is removed to expose the first pad 1118 and the second pad 1119.

Figure 2E:
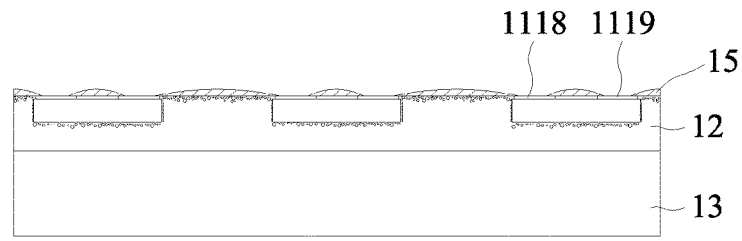
Figure 3E:
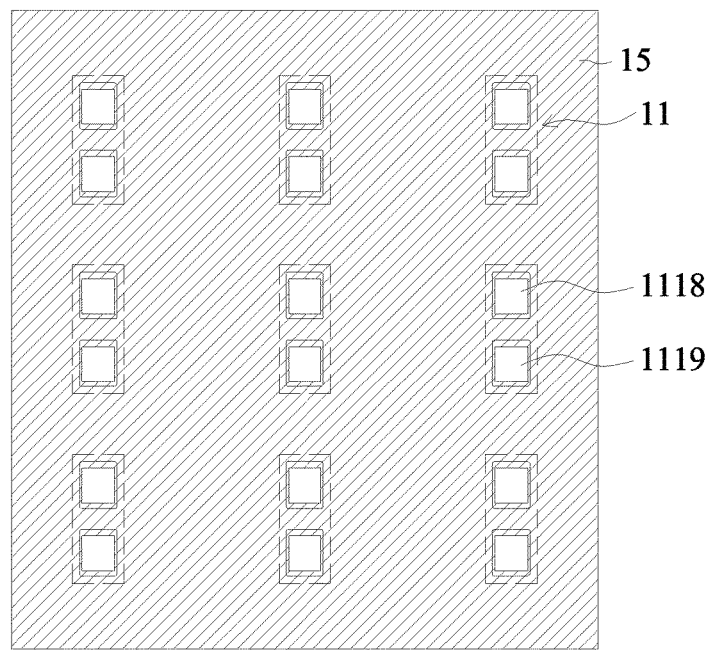

As shown in FIGS. 2E and 3E, an insulation structure 15 is formed to cover the wavelength conversion structure 12 and the light-emitting diodes 11. Specifically, the insulation structure 15 does not fully cover the first pad 1118 and the second pad 1119 to expose a portion of the first pad 1118 and the second pad 1119. In other words, beside the exposed pads 1118, 1119, the other portions are entirely covered by the insulation structure 15. In FIG. 2E, the exposed pads 1118, 1119 have an area larger than that of the pads 1118, 1119 covered by the insulation structure 15. The insulation structure 15 cam be formed by spraying, dispersing or printing.

Figure 2F:
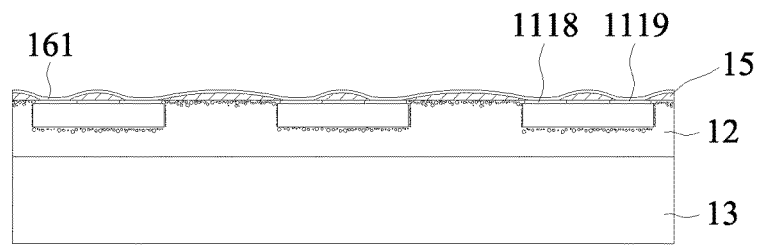
Figure 3F:
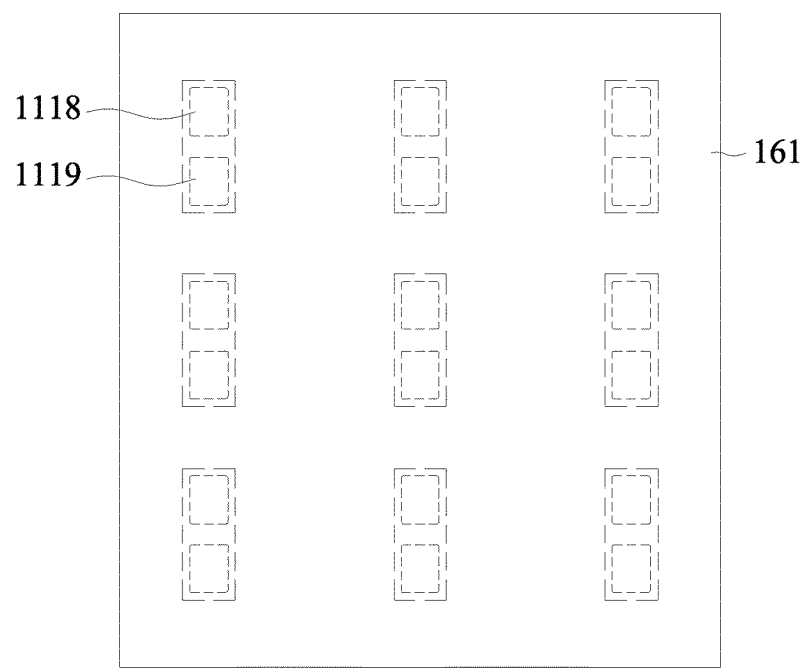

As shown in FIGS. 2F and 3F, a seed layer 161 is formed to cover the exposed pad 1118, 1119 and the insulation structure 15. It is noted that the seed layer 161 has a thickness much less than the pads 1118, or 1119. However, the seed layer 161 is drawn oversized for clarity. The seed layer 161 has a thickness of about 100~1000 nm.

Figure 2G:
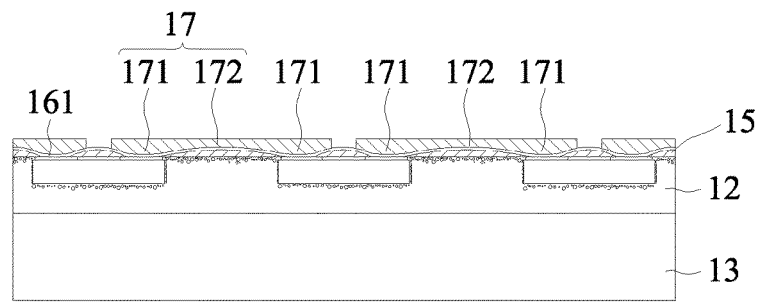
Figure 3G:
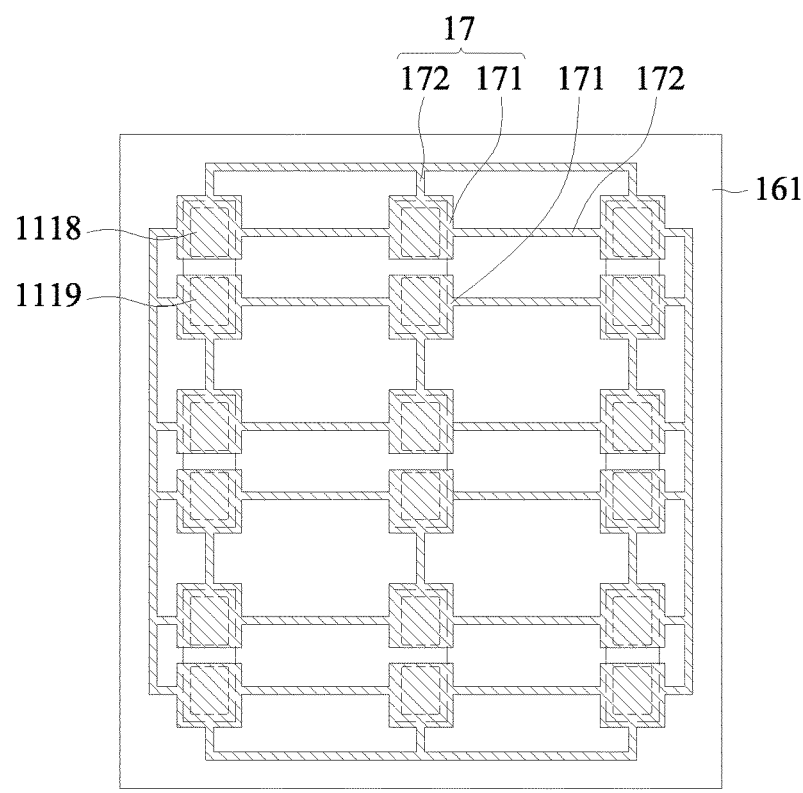

As shown in FIGS. 2G and 3G, a photoresist layer 17 is provided as a mask for the subsequent step of removing the seed layer 161. The photoresist layer 17 is patterned to expose a portion of the seed layer 161. The photoresist layer 17 has a first part 171 and a second part 172. The first part 171 is formed at a position corresponding to the pads 1118, 1119 of each light-emitting diode 11 exposed from the insulation structure 15 and a portion of the insulation structure 15, and has a projected area larger than that of the pads 1118, 1119. The second part 172 has a width less than that of the first part 171 and is formed on the insulation structure 15 for connecting to the first part 171.

Figure 2H:
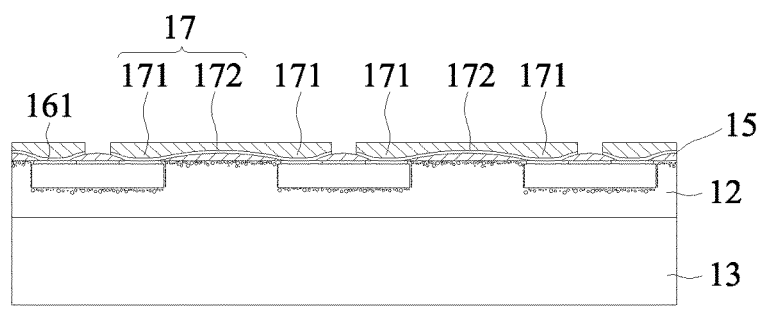
Figure 3H:
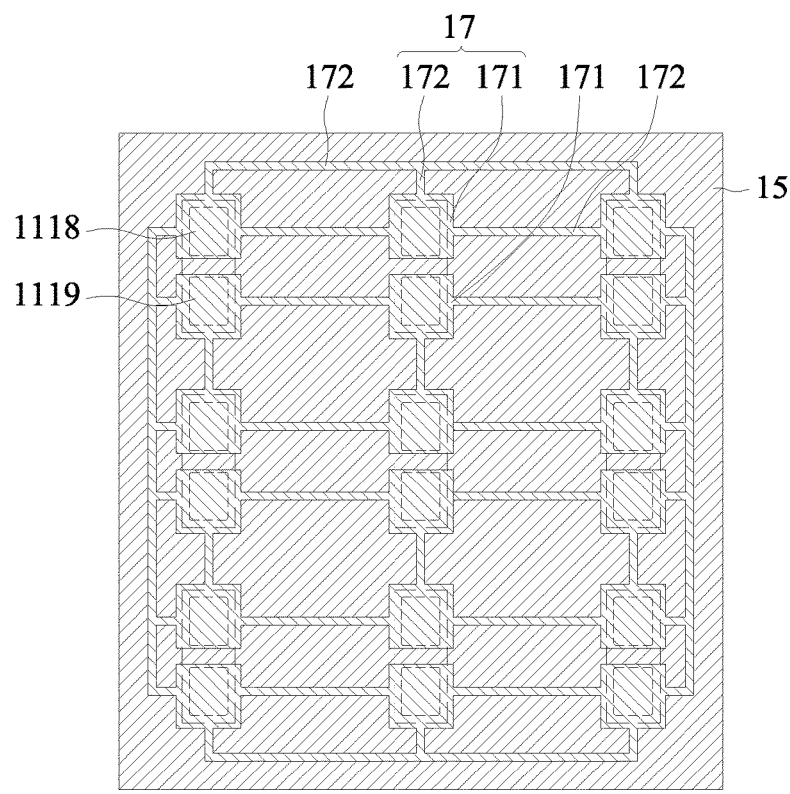

As shown in FIGS. 2H and 3H, the exposed seed layer 161 is removed to expose the insulation structure 15.

Figure 2I:
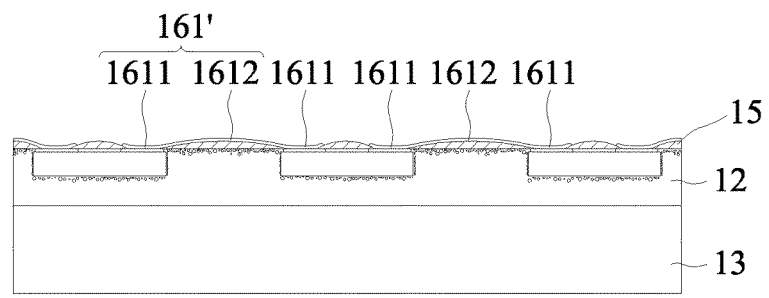
Figure 3I:
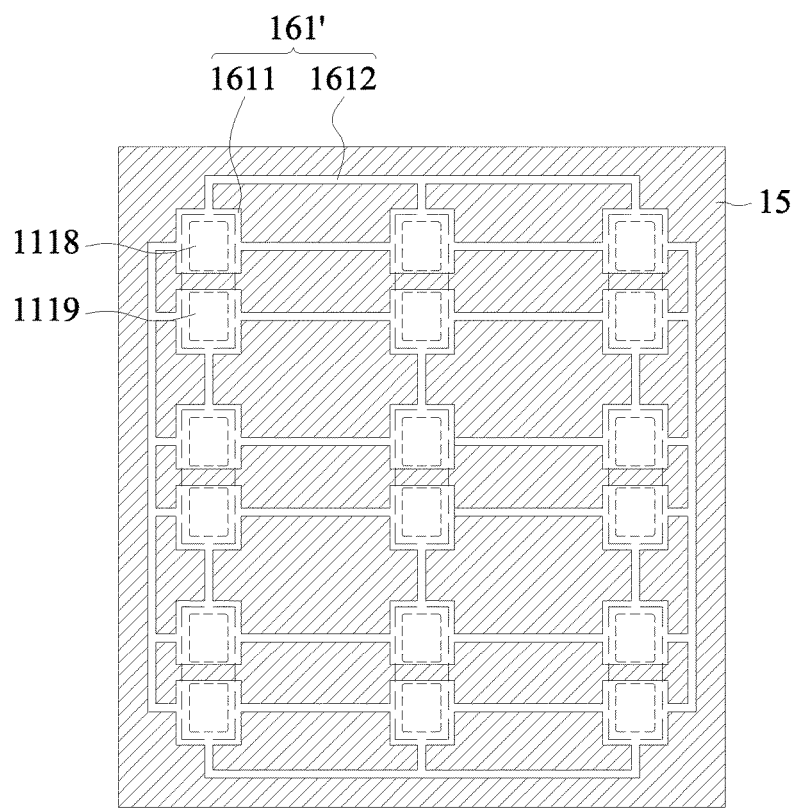

As shown in FIGS. 2I and 3I, the photoresist layer 17 is removed to expose the remaining seed layer 161' on the pads 1118, 1119 and the insulation structure 15. The remaining seed layer 161' has a pattern substantially identical to the photoresist layer 17. Therefore, the remaining seed layer 161' has a first part 1611 covering the pads 1118, 1119 of each light-emitting diode 11 and a portion of the insulation structure 15, and having a projected area larger than that of the corresponding pads 1118, 1119. The remaining seed layer 161' has a second part 1612 covering the insulation structure 15. The second part 1612 has a width smaller than that of the first part 1611. The second part 1612 is connected to the first part 1611 for providing a conductive path for subsequent electroplating process.

Figure 2J:
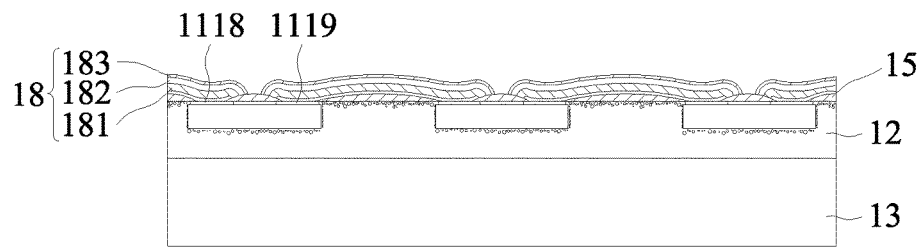
Figure 3J:
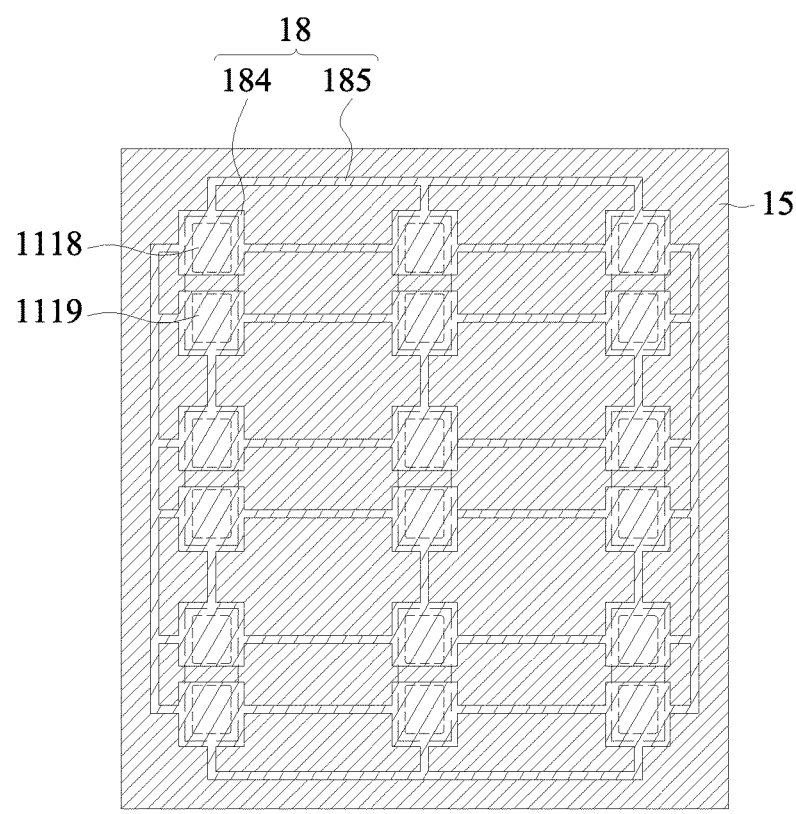
Figure 3K:
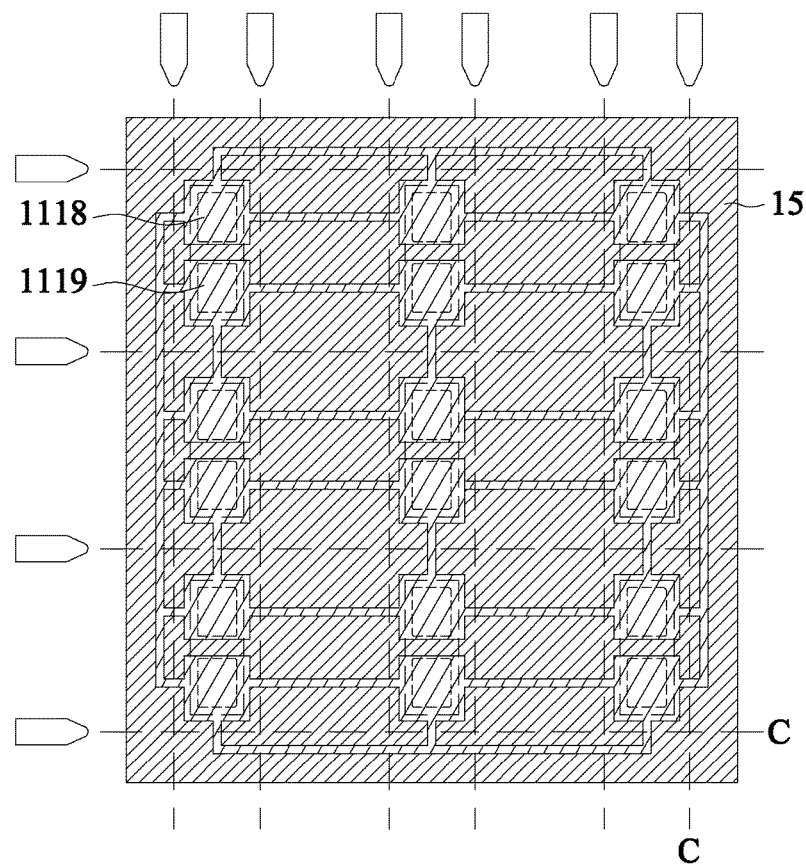
FIG. 3K is a top view showing a cutting step.

As shown in FIGS. 2J and 3J, an electroplating process is performed to form a metal stack 18 at a position corresponding to the remaining seed layer 161', that is, the stack 18 is formed on the first pad 1118, a second pad 1119 and a portion of the insulation structure 15. In one embodiment, the metal stack 18 includes a first metal layer 181, a second metal layer 182, and a third metal layer 183. The first metal layer 181 directly covers the pads 1118, 1119, and the insulation structure 15. The second metal layer 182 is formed on the first metal layer 181 to enclose the entire first metal layer 181 and further to contact the insulation structure 15. The third metal layer 183 is formed on the second metal layer 182 to enclose the entire second metal layer 181 and further to contact the insulation structure 15. In one embodiment, the first metal layer 181 is made of Cu and has a thickness larger than that of the second metal layer 182. The second metal layer 182 is made of Ni and has a thickness larger than that of the third metal layer 183 made of Au. In addition, the plating current density for the first metal layer 181 is 1~5 A/dm$^2$, for the second metal layer 182 is 1~5 A/dm$^2$, and for the third metal layer 183 is 0.5~3 A/dm$^2$.

Since the metal stack 18 is formed at the place where the remaining seed layer 161' is formed, the metal stack 18 has a projected shape substantially identical to that of the remaining seed layer 161'. Accordingly, the metal stack 18 also has a first part 184 formed on the pads 1118, 1119 and the insulation structure 15, and a second part 185 formed on the insulation structure 15. The second part 185 has a width smaller than the first part 184. As the aforesaid description, since the pattern of the remaining seed layer 161' is defined by the photoresist layer 17, a pattern of the metal stack 18 is also decided by the photoresist layer 17. Accordingly, by adjusting the pattern of the photoresist layer 17, the pattern of the metal stack 18 can be also varied. Specifically, the second part 1612 of the remaining seed layer 161' is used for the conductive path, so the pattern of the second part 1612 can be arbitrarily varied as long as it can make current pass therethrough to the first part 1611 of the remaining seed layer 161' during the electroplating process.

The second part 1612 of the remaining seed layer 161' has a width of about 10~500 μm (30 μm, 40 μm, 70 μm, 100 μm, 150 μm, 200 μm, 300 μm, 400 μm). If the second part 1612 of the remaining seed layer 161' has a width less than 10 μm, the metal stack 18 could be difficult to form during the electroplating process. If the width of the second part 1612 is too larger, the manufacturing cost will be increased and the cutter used in the subsequent cutting step could be damaged.

Figure 3L:
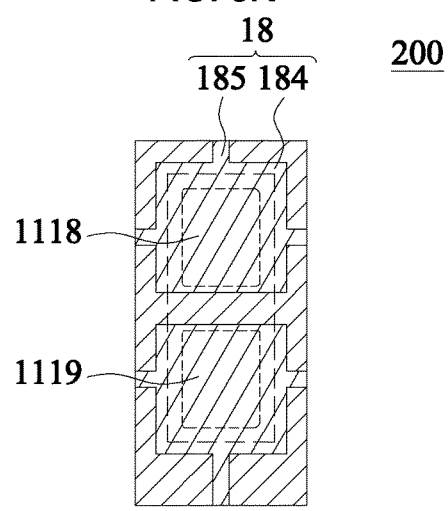
FIG. 3L is a top view of a light-emitting device in accordance with one embodiment of the present disclosure.

As shown in FIG. 3K, a cutting step is performed along the cutting lines (C) to obtain a plurality of separated light-emitting devices 200 (one is shown in FIG. 3L). As shown in FIG. 3L, since the light-emitting devices 200 are separated from each other by cutting the second part 185 of the metal stack 18, a portion of the second part 185 is left in each light-emitting device 200. In other words, the second part 185 in each light-emitting device 200 is used as the aforesaid protrusions. The first part 184 of the metal stack 18 on the first pad 1118 is used as the first electrode 141 and the first part 184 of the metal stack 18 on the second pad 1119 is used as the second electrode 142.

FIGS. 4A, 5A, 6A, and 7A are top views showing the metal stack 18 with different patterns. As descripted above, the pattern of the second part 185 of the metal stack 18 is decided by the pattern of the photoresist layer 17, so the related descriptions and drawings of the other steps before the cutting step can be referred to the corresponding paragraphs and omitted herein for brevity.

Figure 4A:
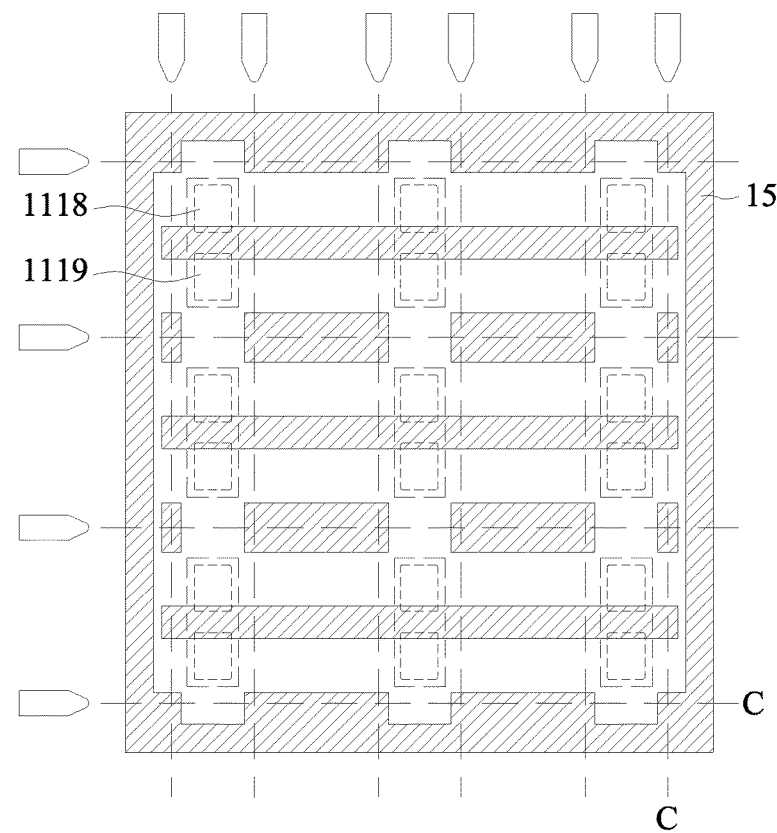
FIGS. 4A, 5A, 6A, and 7A are top views showing the metal stacks with different patterns in accordance with embodiments of the present disclosure.
Figure 4B:
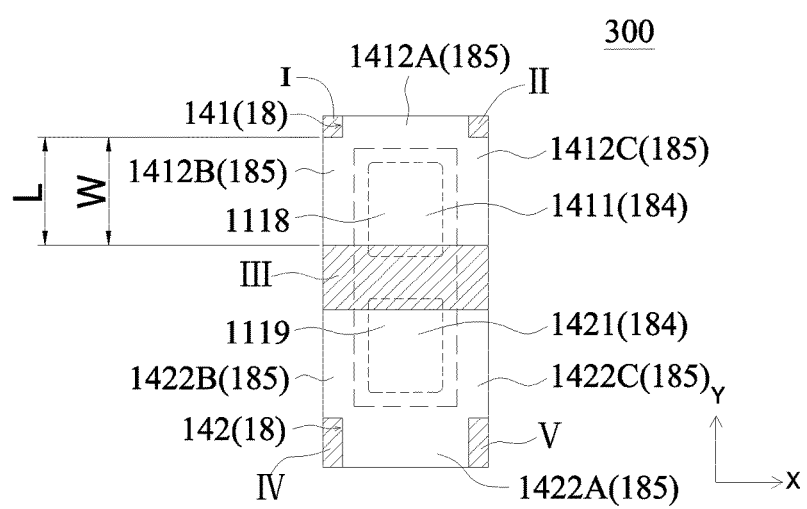
FIGS. 4B, 5B, 6B, and 7B are top views of light-emitting devices in accordance with embodiments of the present disclosure.

A cutting step is performed along the cutting lines (C) in FIG. 4A to obtain a plurality of separated light-emitting devices 300 (one is shown in FIG. 4B). Since the light-emitting devices 300 are separated from each other by cutting the second part 185 of the metal stack 18, a portion of the second part 185 is left in each light-emitting device 300. The first electrode 141 (the metal stack 18) has a main segment 1411 (first part 184) and three protrusions 1412A~C (the second part 185), and the second electrode 142 (the metal stack 18) has a main segment 1421 (first part 184) and three protrusions 1422A~C (the second part 185). Each of the protrusions 1412A~C, 1422A~C has a width (W) equal to the length (L) of the main segment 1411. The first electrode 141 and the second electrode 142 are configured to divide the bottom surface of the light-emitting device 300 into the five regions (I~V) where no electrode is formed.

Figure 5A:
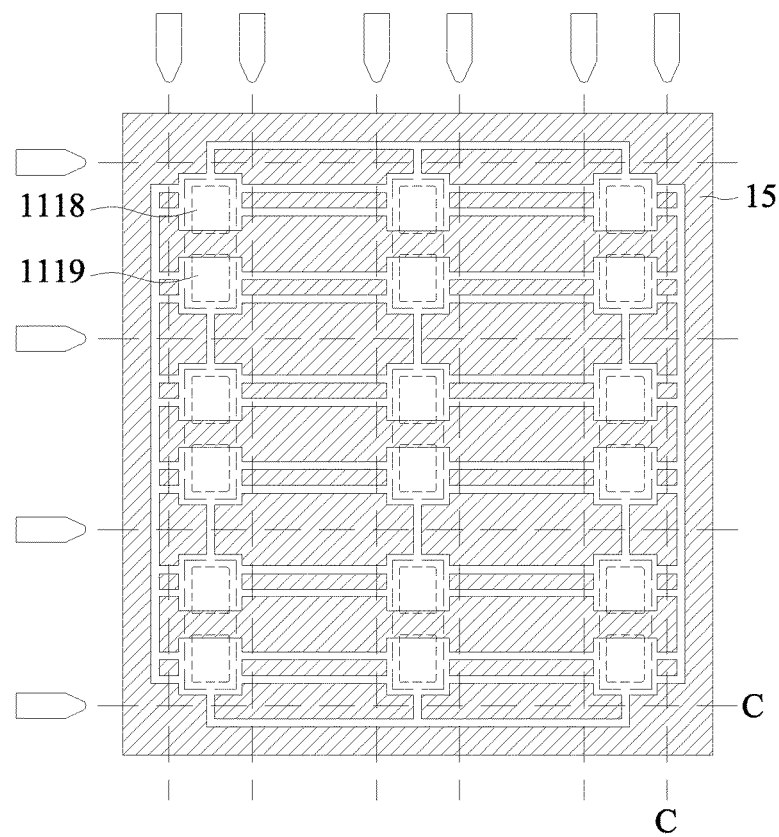
Figure 5B:
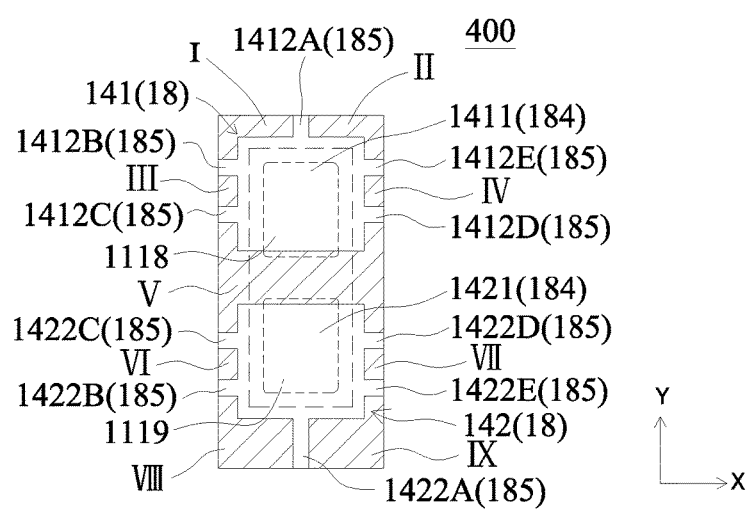

A cutting step is performed along the cutting lines (C) in FIG. 5A to obtain a plurality of separated light-emitting devices 400 (one is shown in FIG. 5B). Since the light-emitting devices 400 are separated from each other by cutting the second part 185 of the metal stack 18, a portion of the second part 185 is left in each light-emitting device 400. The first electrode 141 (the metal stack 18) has a main segment 1411 (first part 184) and five protrusions 1412A~E (the second part 185), and the second electrode 142 (the metal stack 18) has a main segment 1421 (first part 184) and five protrusions 1422A~E (the second part 185). The protrusions 1412B~C, 1422B~C are parallel to each other and the protrusions 1412D~E, 1422D~E are parallel to each other. The first electrode 141 and the second electrode 142 are configured to divide the bottom surface of the light-emitting device 400 into the nine regions (I~IX) where no electrode is formed.

Figure 6A:
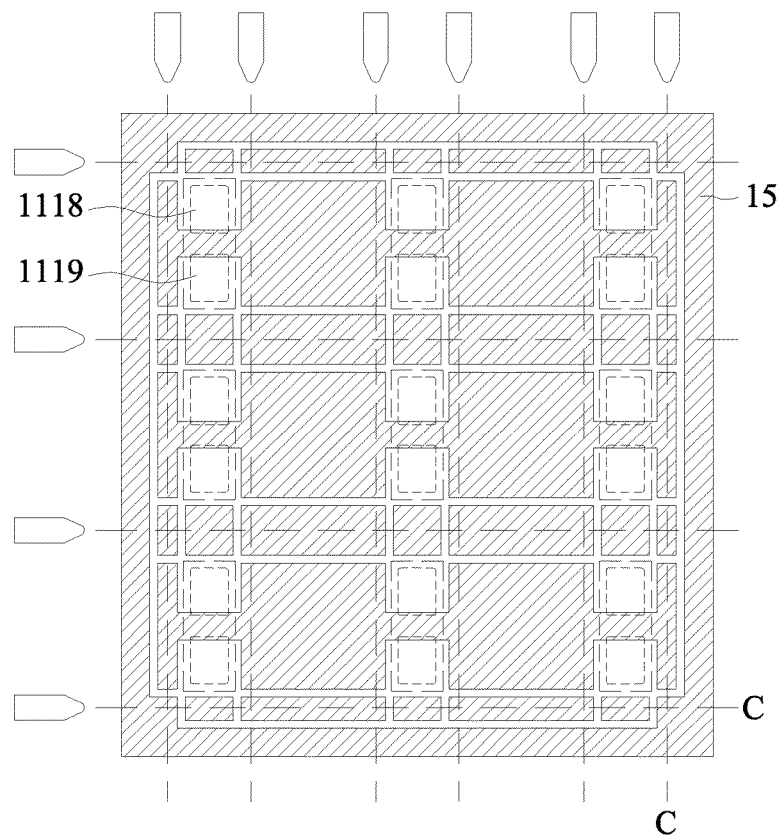
Figure 6B:
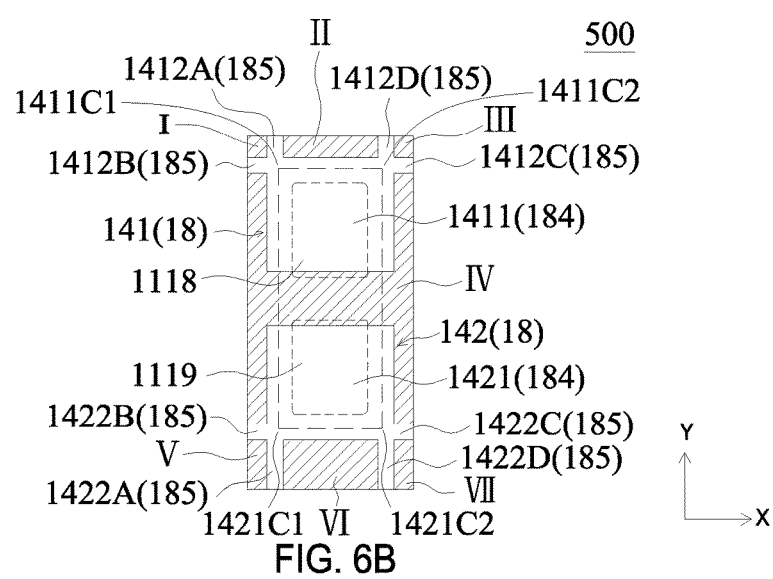

A cutting step is performed along the cutting lines (C) in FIG. 6A to obtain a plurality of separated light-emitting devices 500 (one is shown in FIG. 6B). Since the light-emitting devices 500 are separated from each other by cutting the second part 185 of the metal stack 18, a portion of the second part 185 is left in each light-emitting device 500. The first electrode 141 (the metal stack 18) has a main segment 1411 (first part 184) and four protrusions 1412A~D (the second part 185), and the second electrode 142 (the metal stack 18) has a main segment 1421 (first part 184) and four protrusions 1422A~C (the second part 185). The protrusions 1412A~B, 1422A~B are at a first corner 1411C1, 1421C1 of the main segment 1411, 1421, respectively. The protrusions 1412C~D, 1422C~D are at a second corner 1411C2, 1421C2 of the main segment 1411, 1421, respectively. The first electrode 141 and the second electrode 142 are configured to divide the bottom surface of the light-emitting device 500 into the seven regions (I~VII) where no electrode is formed.

Figure 7A:
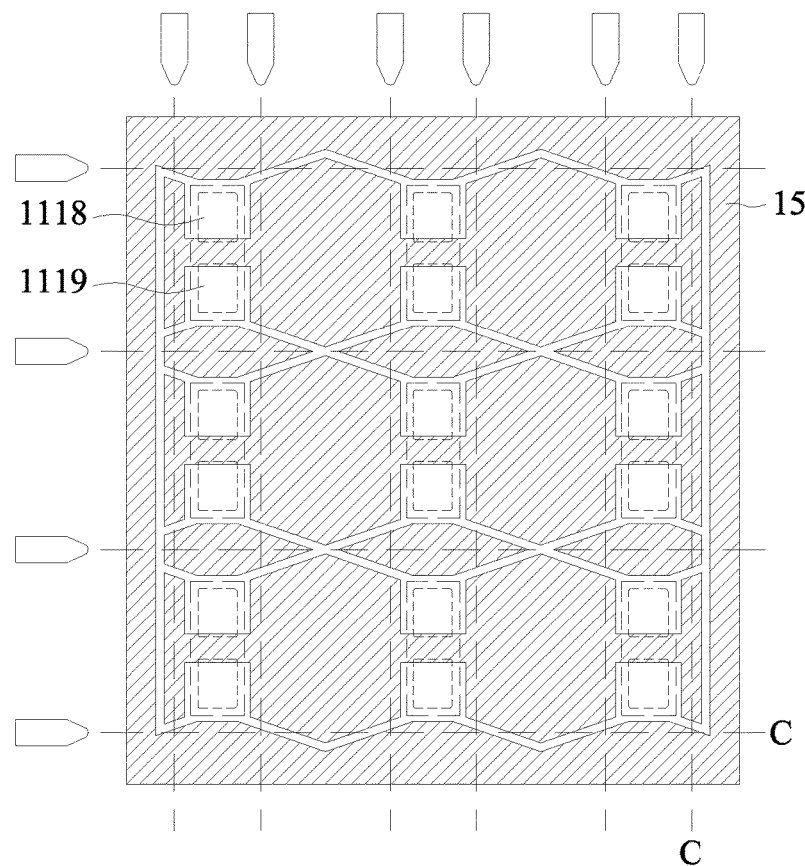
Figure 7B:
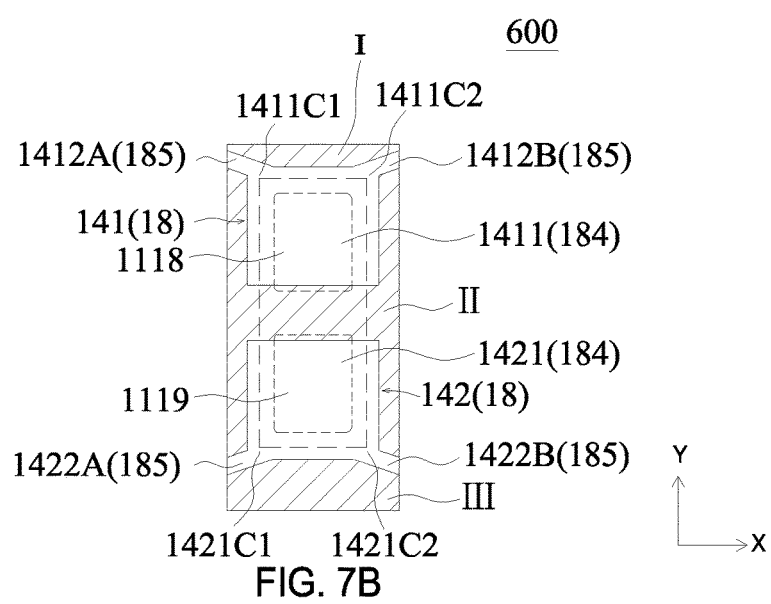

A cutting step is performed along the cutting lines (C) in FIG. 7A to obtain a plurality of separated light-emitting devices 600 (one is shown in FIG. 7B). Since the light-emitting devices 600 are separated from each other by cutting the second part 185 of the metal stack 18, a portion of the second part 185 is left in each light-emitting device 600. The first electrode 141 (the metal stack 18) has a main segment 1411 (first part 184) and two protrusions 1412A~B (the second part 185), and the second electrode 142 (the metal stack 18) has a main segment 1421 (first part 184) and two protrusions 1422A~B (the second part 185). The protrusions 1412A, 1422A are arranged at a first corner 1411C1, 1421C1 of the main segment 1411, 1421, respectively. The protrusions 1412B, 1422B are arranged at a second corner 1411C2, 1421C2 of the main segment 1411, 1421, respectively. The protrusions 1421A~B, 1422A~B extend in a direction inclined with respect to the X direction or the Y direction. Likewise, the first electrode 141 and the second electrode 142 are configured to divide the bottom surface of the light-emitting device 600 into the three regions (I~III) where no electrode is formed.

Figure 8A:
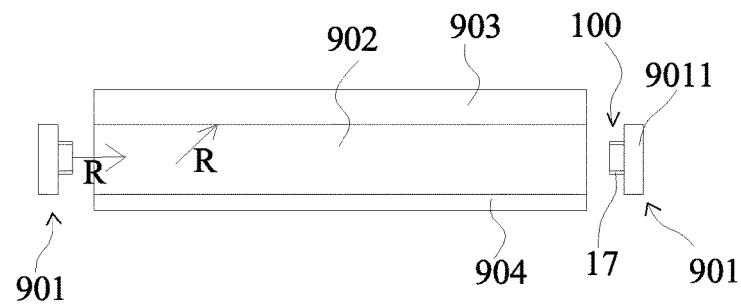
FIG. 8A is a cross-sectional view of an edge-lit backlight module.

FIG. 8A is a cross-sectional view of an edge lit backlight module 900 used in an LCD display. The backlight module 900 includes the light-emitting source 901, a light guide plate 902, a diffusor 903, and a reflective structure 904. The light-emitting source 901 includes a carrier 9011, a plurality of light-emitting devices 100 disposed on the carrier 9011 and an electrical circuit (not shown) for controlling the light-emitting devices 100. The light-emitting source 901 is arranged on one side of the light guide plate 902 and can emit light (R) toward the light guide plate 902. The light (R) in the light guide plate 902 can be guided to move toward the diffusor 903. The reflective structure 904 is configured to reflect the light toward the diffusor 903. The first electrode 141 and the second electrode 142 are mounted on the electrical circuit through soldering.

Figure 8B:
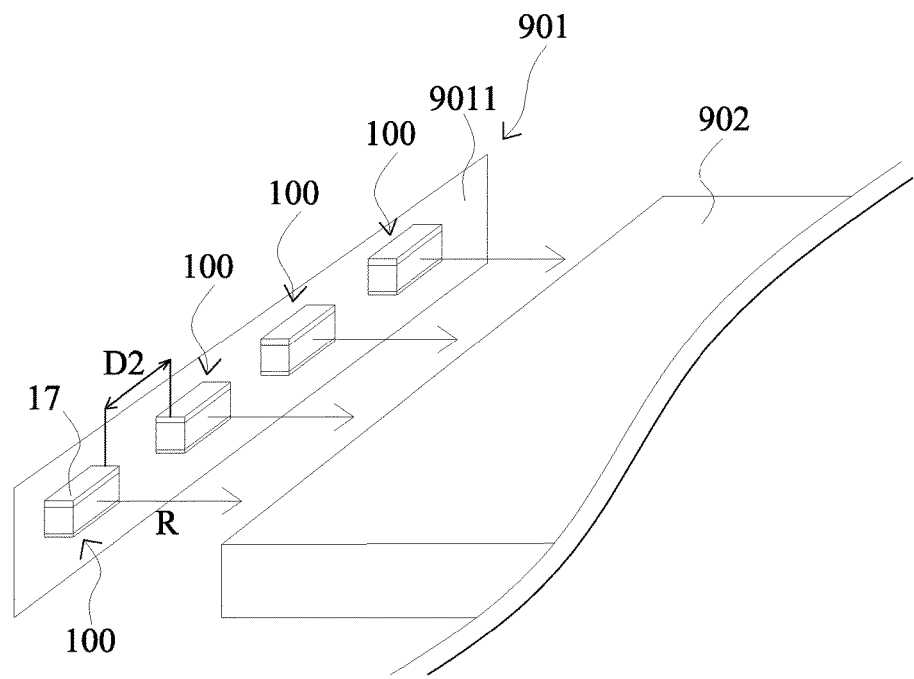
FIG. 8B is a perspective view of a light-emitting source and a light guide.

FIG. 8B is a perspective view of the light-emitting source 901 and the light guide 902. The light-emitting devices 100 are arranged along the X direction to form one-dimensional array. The number and arrangement of the light-emitting devices 100 are illustrative, and not intended to limit the scope of the present disclosure.

In application, the aforesaid light-emitting device can be used to form a light engine applied in bulb, downlight, capsule lamp, or MR16. Alternatively, the aforesaid light-emitting device can be applied in a flash module for mobile phone or camera.

The temporary tape 191 includes blue tape, thermal release sheet/tape, UV release tape or polyethylene terephthalate (PET) for temporarily fixing the light-emitting diode or the light-emitting device during manufacturing. The light-transmissive structure 13 can includes sapphire, SiC, ZnO, GaN, Si, glass, quartz, or ceramic material (such as MN, or $Al_2O_3$).

The foregoing description has been directed to the specific embodiments of this disclosure. It will be apparent to those having ordinary skill in the art that other alternatives and modifications can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device with a first outermost sidewall and a second outermost sidewall, comprising:
  a light-emitting diode, having a side surface and a pad with a bottommost surface in a cross sectional view;
  an insulation structure, in the cross sectional view, having an outermost surface and a portion which is directly formed on the bottommost surface; and
  an electrode, formed on the portion in a configuration of being electrically connected to the pad, and having a segment, a first protrusion, and a second protrusion,
  wherein the segment extends beyond the side surface in the cross sectional view,
  wherein in a bottom view, the first protrusion and the second protrusion are formed integrally with the segment, and the first protrusion extended in a first direction from the segment to the first outermost sidewall, and the second protrusion is extended in a second direction from the segment to the second outermost sidewall, and
  wherein the segment and the first protrusion are directly formed under the outermost surface.

2. The light-emitting device of claim 1, wherein the first protrusion is narrower than the segment.

3. The light-emitting device of claim 1, further comprising a reflective wall overlapping the first protrusion in a direction.

4. The light-emitting device of claim 1, wherein the pad has an area less than that of the segment.

5. The light-emitting device of claim 1, wherein the pad is devoid of overlapping the first protrusion.

6. The light-emitting device of claim 1, wherein the electrode comprises a first layer, and a second layer enclosing the first layer to contact the insulation structure.

7. The light-emitting device of claim 1, wherein the first protrusion has a width not less than 10 µm.

8. The light-emitting device of claim 1, wherein the first protrusion and the second protrusion are extended in opposite directions.

9. The light-emitting device of claim 1, further comprising a wavelength conversion structure enclosing the light-emitting diode.

10. The light-emitting device of claim 9, wherein the segment overlaps the wavelength conversion structure in a direction.

11. The light-emitting device of claim 1, wherein the light-emitting diode comprises a plurality of light-emitting bodies electrically connected with each other.

12. The light-emitting device of claim 11, wherein the light-emitting diode further comprises a trench formed between the plurality of light-emitting bodies.

13. The light-emitting device of claim 1, wherein the electrode is directly connected to the pad.

14. The light-emitting device of claim 1, wherein the first protrusion has a surface which is located at a lowermost elevation of the light-emitting device.

15. The light-emitting device of claim 1, wherein the first protrusion does not extend beyond the first outermost sidewall.

16. The light-emitting device of claim 1, wherein the first protrusion is made of a metallic material.

17. The light-emitting device of claim 1, wherein the segment and the first protrusion are formed on a same surface.

18. The light-emitting device of claim 1, wherein the segment and the first protrusion are made of a same material.

19. The light-emitting device of claim 1, wherein the second protrusion is formed integrally with the segment and the first protrusion.

* * * * *